US007011866B1

(12) United States Patent
Yamanaka et al.

(10) Patent No.: US 7,011,866 B1
(45) Date of Patent: Mar. 14, 2006

(54) METHOD AND APPARATUS FOR FILM DEPOSITION

(75) Inventors: Hideo Yamanaka, Kanagawa (JP); Kikuo Kaise, Kanagawa (JP)

(73) Assignee: Sony Corporation, (JP)

( * ) Notice: Subject to any disclaimer, the term of this patent is extended or adjusted under 35 U.S.C. 154(b) by 912 days.

(21) Appl. No.: 09/646,680

(22) PCT Filed: Jan. 24, 2000

(86) PCT No.: PCT/JP00/00328

§ 371 (c)(1),
(2), (4) Date: Dec. 4, 2000

(87) PCT Pub. No.: WO00/44033

PCT Pub. Date: Jul. 27, 2000

(30) Foreign Application Priority Data

Jan. 22, 1999 (JP) ................................ 11/013843
May 31, 1999 (JP) ................................ 11/151466

(51) Int. Cl.
*C23C 16/00* (2006.01)

(52) U.S. Cl. .............................. 427/255.28; 427/248.1

(58) Field of Classification Search ............ 427/248.1, 427/255.28, 255.23, 249.1, 249.6, 249.7, 427/249.8, 249.11, 488–491, 569–579
See application file for complete search history.

(56) References Cited

U.S. PATENT DOCUMENTS 3,769,670 A * 11/1973 Schrank ..................... 29/25.11
4,668,365 A * 5/1987 Foster et al. ........... 204/192.23
4,961,958 A * 10/1990 Desphandey et al. ....... 427/577
4,974,544 A 12/1990 Ohta
5,058,527 A 10/1991 Ohta et al.
5,112,466 A 5/1992 Ohta et al.
5,145,712 A 9/1992 Jesser et al.
5,160,544 A 11/1992 Garg et al.
5,378,285 A 1/1995 Mitani et al.
5,384,018 A 1/1995 Ramm et al.
5,464,499 A * 11/1995 Moslehi et al. ............. 438/729
5,554,222 A 9/1996 Nishihara et al.
5,900,161 A * 5/1999 Doi ............................ 216/60
5,942,854 A 8/1999 Ryoji et al.
6,045,877 A * 4/2000 Gleason et al. ............. 427/522
6,101,972 A 8/2000 Bluck et al.
6,161,499 A 12/2000 Sun et al.
6,203,862 B1 3/2001 Bluck et al.
6,211,622 B1 4/2001 Ryoji et al.
6,225,241 B1 * 5/2001 Miyoshi ..................... 438/794
6,291,343 B1 * 9/2001 Tseng et al. ................ 438/653
6,349,669 B1 2/2002 Matsumura et al.

(Continued)

FOREIGN PATENT DOCUMENTS

JP 61-247018 4/1986

(Continued)

*Primary Examiner*—Timothy Meeks
*Assistant Examiner*—Eric B. Fuller
(74) *Attorney, Agent, or Firm*—Radar, Fishman,& Grauer PLLC; Ronald P. Kananen

(57) ABSTRACT

A reaction gas made of a hydrogen-based carrier gas and a silane gas or the like is brought in contact with a heated catalyzer of tungsten or the like, and a DC voltage not higher than a glow discharge starting voltage or a voltage produced by superimposing an AV voltage or an RF voltage on the DC voltage is applied on the produced reactive species, so as to provide kinetic energy and carry out vapor growth of a predetermined film on a substrate, thereby providing a film of high quality.

22 Claims, 20 Drawing Sheets

U.S. PATENT DOCUMENTS

2004/0134429 A1 7/2004 Yamanaka et al.

FOREIGN PATENT DOCUMENTS

JP 63-40314 2/1988
JP 6-25856 2/1994
JP 10-72284 3/1998
JP 10-72286 3/1998
WO WO11/44033 7/2000

* cited by examiner

COMBINATION OF MATERIAL GAS AND FILM TO BE FORMED

| PRODUCED FILM | MATERIAL GAS |
|---|---|
| ① Si OR POLYCRYSTAL Si | $SiH_4$, $SiHCl_3$, $SiH_2Cl_2$, $SiCl_4$<br>$Si_2H_6$ |
| ② $SiO_2$ | $SiH_4$, $SiHCl_2$, $SiH_2Cl_2$, $SiCl_4$, $SiBr_4$, $SiI_4$,<br>$SiF_4$, $Si(OC_2H_4)_4$, $Si(OC_2H_5)_4$, $(C_2H_5)Si(OC_2H_5)_3$,<br>$C_5H_{11}Si(OC_2H_5)_3$, $C_6H_5Si(OC_2H_5)_3$,<br>$(CH_3)_2Si(OC_2H_5)_2$, AND $O_2$, NO, $N_2O$, $NO_2$, $CO_2$+$H_2$, $H_2O$ |
| ③ BPSG, BSG, PSG OR AsSG | MIX FOLLOWING GAS WITH MATERIAL GAS OF ②<br>$PH_3$, $B_2H_6$, $AsH_3$, $PO(OCH_3)_3$,<br>$B(OCH_3)_3$, $B(OC_3H_7)_3$ |
| ④ SiNx | MIX $NH_3$, $N_2H_4$, $N_2$, WITH $SiH_4$, $SiH_6$, $SiHCl_3$, $SiH_2Cl_2$, $SiH_3Cl$,<br>$SiCl_4$, $SiBr_4$ ETC.<br>Ar, He, ETC. AS CARRIER GAS |
| ⑤ SiOxNy | SAME AS MATERIAL GAS OF ②,④ |
| ⑥ Al | $AlCl_3$, $Al(CH_3)_3$(TMA), $Al(C_2H_5)_3$(TEA), $Al(OC_3H_7)_3$<br>$H_2$ AS REDUCTION GAS |
| ⑦ $Al_2O_{3-x}$ | ADD $CO_2$+$H_2$, $O_2$, $H_2O$ TO MATERIAL GAS OF ⑥ |
| ⑧ $In_2O_3$ | $In(CH_3)_3$(TMI), $In(C_2H_5)_3$(TEI), AND $O_2$, $H_2O$, $CO_2$ |
| ⑨ REFRACTORY METAL | FLUORIDE ($MoF_6$, $WF_6$),<br>CHLORIDE ($MoCl_5$, $WCl_6$, $TaCl_5$, $TiCl_4$, $ZrCl_4$),<br>ORGANIC COMPOUND ($Ta(OC_2H_5)_5$, $(PtCl_2)_2(CO)_3$,<br>$W(CO)_6$, $Mo(CO)_6$ |
| ⑩ SILICIDE | MIX SILANE-BASED GAS SUCH AS $SiH_4$, $Si_2H_6$, ETC.<br>WITH MATERIAL GAS OF ⑨ |
| ⑪ TiN | $TiCl_4$ + $N_2$(+$NH_3$) |
| ⑫ TiON | ADD $O_2$, $H_2O$ TO $TiCl_4$ + $N_2$(+$NH_3$) |
| ⑬ Cu | HEXAFLUOROACETYLACETONATE COPPER<br>$(Cu(HFA)_2)$ AND $C((HFA)_2$ + $H_2O$<br>OTHER MATERIALS OF CHELATE COMPOUND ARE<br>$Cu(DPM)_2$, $Cu(AcAc)_2$, $Cu(FOD)_2$, $Cu(PPM)_2$, Cu(HFA)TMVS |
| ⑭ Al-Si OR Al-Si-Cu | ADD MATERIAL GAS OF ① OR ⑬ TO MATERIAL GAS OF ⑥ |

* ADD EACH MATERIAL GAS TO HYDROGEN-BASED CARRIER GAS BASED ON $H_2$ GAS SUCH AS $H_2$, $H_2$+Ar, $H_2$+Ne, $H_2$+He, $H_2$+Kr, ETC.

FIG.23

METHOD AND APPARATUS FOR FILM DEPOSITION

TECHNICAL FIELD

This invention relates to a film forming method and a film forming apparatus for vapor growth of a predetermined film made of polycrystal silicon or the like.

BACKGROUND ART

Conventionally, a chemical vapor deposition (CVD) method for a polycrystal silicon layer has been used in manufacturing a metal-insulator-semiconductor field effect transistor (MISFET), for example, a MIS thin film transistor (MISTFT), in which a polycrystal silicon layer formed on a substrate is used as source, drain and channel regions.

In the case of forming a polycrystal silicon layer of this type by the ordinary CVD method, reactive species which are produced by decomposition of a material gas in a vapor phase reach the substrate and react on the substrate, thereby forming a film. Alternatively, the reactive species react in a region very close to the surface of the substrate and are deposited thereon. In order for the film to be produced and epitaxially grow, the reactive species must migrate on the surface of the substrate.

In a plasma CVD method known as a CVD method, a two-frequency method for utilizing plasma potential control with the action of a high-frequency field or for applying a low-frequency bias field is used to control the migration or the kinetic energy of deposition species. In an ion cluster beam (ICB) method, an acceleration voltage is controlled.

These film forming methods have problems as follows.

First, in the case of the plasma CVD method, the use of plasma leads to the following drawbacks.

(1) Lack of uniformity and fluctuation of a plasma field, and a non-uniform electric field in plasma-induced electric charges are generated. These may cause damages and short circuits t the transistor (e.g., charge-up or discharge breakdown of a gate oxide film, discharge between wirings, and the like). Particularly, such phenomenon tends to occur at the time of switching on/off the plasma.

(2) There is a possibility of ultraviolet damage due to light emission from the plasma.

(3) Plasma discharge is difficult in a large area, and occurrence of a standing wave makes it difficult to realize uniformity.

(4) The device is complicated and expensive and requires complicated maintenance work.

In the case of the ICB method, too, since cluster ions are led onto the substrate through an aperture of an accelerating electrode so as to collide with the substrate, it is difficult to realize uniformity and to form a film of a large area, that is, a film on a large substrate.

On the other hand, the catalyzed CVD method disclosed in the Japanese Publication of Unexamined Patent Application No. S63-40314 draws attention as an excellent CVD method which enables formation of a polycrystal silicon film or a silicon nitride film at a low temperature on an insulating substrate such as a glass substrate.

According to the catalyzed CVD method, for example, a silane gas is brought in contact with a heated metal catalyzer and is thus decomposed, thereby forming reactive species having high energy, for example, a radical silicon molecule or a group of molecules, a silicon atom or a group of atoms, and a radical hydrogen ion. These are brought in contact with the substrate so as to react and be deposited thereon.

Therefore, a silicon film can be deposited in a large area at a temperature lower than the deposition temperature of the ordinary thermal CVD method and without using plasma.

In the catalyzed CVD method as described above, formation of a film is controlled by a relatively small number of parameters such as the temperature of the substrate, the temperature of the catalyzer, the gas pressure or the flow rate of the reaction gas. Although this proves that the catalyzed CVD method is a simple method, particularly the momentum of deposition species can only be controlled in accordance with the kinetic theory of gases. That is, the migration or the kinetic energy of deposition species is only the thermal energy in vacuum. Since it depends exclusively on the thermal energy, lowering of the deposition temperature is restricted. Therefore, it is difficult to use a plastic film substrate having a poor heat resistance property and the degree of freedom in selection of the substrate material is limited. Also, since the control of the momentum of deposition species is insufficient, burying of a metal for connection into a via-hole (through-hole for connection between wirings) having a particularly large aspect ratio and the step coverage tend to be insufficient.

SUMMARY OF THE INVENTION

In view of the foregoing status of the art, it is an object of the present invention to provide a film forming method which controls the kinetic energy of reactive species (deposition species and their precursors) and radical ions like silicon ions of high energy or radical hydrogen ions while utilizing the advantages of the above-described catalyzed CVD method, thereby enabling improvement in tight contact between a produced film and a substrate, improvement in the density of the produced film, improvement in the forming speed, improvement in the smoothness of the produced film, improvement in the burying property into a via-hole and the step coverage, further lowering of the temperature of the substrate, and stress control for the produced film without damaging the substrate, and thus enabling a film of high quality, and a film forming apparatus used for this method.

In a film forming method according to the present invention, a reaction gas is brought into contact with a heated catalyzer and an electric field of not higher than a glow discharge starting voltage is caused to act on the produced reactive species, thereby providing kinetic energy and carrying out vapor growth of a predetermined film on a substrate.

A film forming apparatus according to the present invention includes reaction gas supply means, a catalyzer, heating means for the catalyzer, electric field application means for applying an electric field of not higher than a glow discharge starting voltage, and a suscepter for supporting a base on which a film to be formed.

In the film forming method and apparatus according to the present invention, a reaction gas is brought into contact with a heated catalyzer as in the conventional catalyzed CVD method, and in depositing the produced deposition species or their precursors and radical ions onto the base, an electric field of not higher than a glow discharge starting voltage, that is, an electric field of not higher than a plasma generation voltage in accordance with the Paschen's law, is caused to act to provide kinetic energy. Therefore, the film forming method and apparatus has the following advantages.

(1) A directional acceleration field with the above-described voltage as well as the catalytic action of the catalyzer and its thermal energy are applied to the deposition species or their precursors and the radical ions. Therefore, the kinetic energy is increased and the deposition species or the like can be efficiently led onto the base. Also, sufficient migration on the base and sufficient diffusion in a film in the process of formation are realized. Thus, since the kinetic energy of the reactive species generated by the catalyzer can be controlled independently for each electric field in comparison with the conventional catalyzed CVD method, it is possible to realize improvement in tight contact between the produced film and the case improvement in the density of the produced film, uniformity or improvement in the smoothness of the produced film, improvement in the burying property into the via-hole and the step coverage, further lowering of the temperature of base, and stress control for the produced film, and a film of high quality such as a silicon film or a metal film having a bulk-like property can be obtained.

(2) Since no plasma is generated, there is no damage due to plasma and a film of low stress is provided.

(3) Since the reactive species generated by the catalyzer can be controlled independently for each electric field and can be efficiently deposited on the base, high utilization efficiency of the reaction gas, a higher forming speed and reduction in cost can be realized.

(4) A much more simple and inexpensive apparatus is realized in comparison with the plasma CVD method. In this case, though operation can be done under a reduced pressure or under a normal pressure, an apparatus of normal-pressure type is more simple and inexpensive than an apparatus of reduced-pressure type.

(5) Since the above-described electric field is applied in the normal-pressure type, too, a film of high quality having excellent density, uniformity and tight contact is provided. In this case, too, the normal-pressure type realizes a greater throughput, higher productivity and greater reduction in cost than the reduced-pressure type.

(6) Even when the temperature of the base is lowered, the large kinetic energy of the reactive species enables formation of a film of good quality. therefore, the temperature of the base can be further lowered and a large and inexpensive insulating substrate such as a glass substrate or a heat-resistant resin substrate can be used to reduce the cost.

The other objects and specific advantages of the present invention will be clarified by the following description of the embodiments.

BRIEF DESCRIPTION OF THE DRAWINGS

FIG. 23 shows a combination of various material gases and produced films in DC, RF/DC or AC/DC-bias catalyzed CVD according to a thirteenth embodiment of the present invention.

DETAILED DESCRIPTION OF THE PREFERRED EMBODIMENTS

Figure 1:
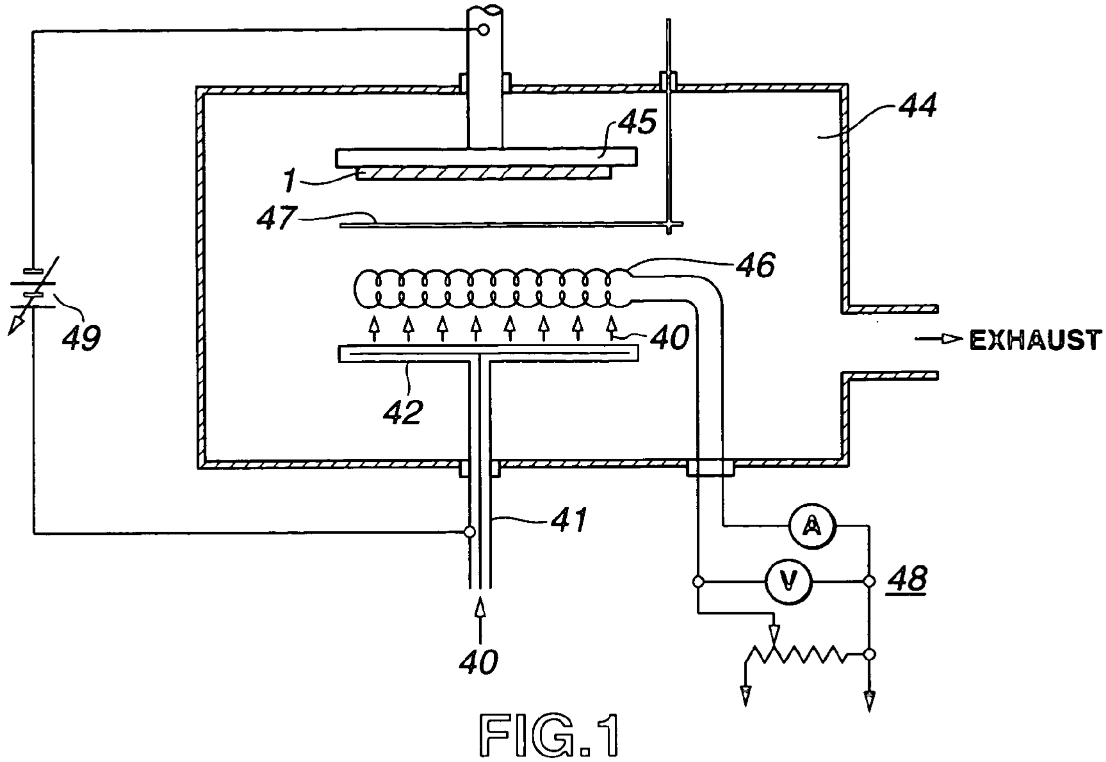
FIG. 1 is a schematic cross-sectional view showing a DC-bias catalyzed CVD device according to a first embodiment of the present invention.

The film forming method according to the present invention and the film forming apparatus used for this method will now be described with reference to the drawings.

In the present invention, it is desired to apply a DC voltage of not higher than a glow discharge starting voltage, that is, a voltage not higher than a plasma-generating voltage determined by the Paschen's law, for example, a voltage of not higher than 1 kV and not less than tens of V, as the above-described electric field, and to direct the above-described reactive species toward the base.

As a voltage which is not higher than the glow discharge starting voltage and is produced by superimposing an AC voltage on the DC voltage, that is, a voltage not higher than the plasma-generating voltage determined by the Paschen's law, for example, a voltage of not higher than 1 kV and not less than tens of V is applied, the kinetic energy with a minute change in the electric field due to the AV voltage superimposed on the DC voltage can be provided for the reactive species. Therefore, in addition to the above-described effect, a uniform film having highly tight contact and high density can be formed which provides good step coverage on the base surface of a complicated shape having steps and a via-hole of a high aspect ratio. The same advantages can also be realized when only a high-frequency AC voltage, or only a low-frequency AC voltage, or a voltage produced by superimposing a high-frequency AC voltage on a low-frequency AC voltage is applied as the voltage forming the electric field (its absolute value is not higher than the glow discharge starting voltage).

In the above-described case, the AC voltage may be a high-frequency voltage (RF, VHF, UHF, microwave) and/or a low-frequency voltage (AC). However, it is preferred that the frequency of the high-frequency voltage is 1 MHZ to 10 GHz and that the frequency of the low-frequency voltage is less than 1 MHZ.

For application of the electric field, a method of applying a positive electrode potential to an electrode and applying a negative electrode (or ground) potential to a suscepter (substrate), or a method of applying a ground potential to the electrode and applying a negative electrode potential to the suscepter (substrate) may be employed. The method may be determined in accordance with the structure of the apparatus, the type of the power source, and the bias effect.

In the film forming method and the film forming apparatus according to the present invention, a catalyzer can be installed between the base or suscepter and the electrode for applying the electric field. In this case, it is preferred to form a gas supply port for leading out a reaction gas at the electrode.

Also, the catalyzer and the electrode for applying the electric field may be installed between the base or suscepter and the reaction gas supply means. It is desired that this electrode is made of a high heat-resistant material such as a material having the same melting point as the catalyzer or a higher melting point. (This applies to the following description.)

The catalyzer or the electrode for applying the electric field may be formed in the shape of a coil, wire, mesh or porous plate, and a plurality of such catalyzers or electrodes may be provided along the gas flow. Thus, the gas flow can be effectively formed and the contact area between the catalyzer and the gas can be increased to generate sufficient catalytic reaction. In the case where the plurality of catalyzers or electrodes are provided along the gas flow, these catalyzers or electrodes may be made of the same or different materials. Also, different electric fields such as DC and AC/DC, DC and RF/DC, AC/DC and RF/DC may be applied to control the plurality of catalyzers independently.

At the time of film formation or during film formation, ions may be generated in the reaction gas due to the catalytic action of the catalyzer and may charge up the base to deteriorate the performance of the film or device. In order to prevent this, it is desired to irradiate the reactive species with charged particles (such as electron beams or protons, particularly electron beams) so as to neutralize the ions. That is, charged particle irradiation means may be installed near the suscepter.

After vapor growth of a predetermined film, the base is taken out of the deposition chamber and a voltage is applied between predetermined electrodes, for example, between the suscepter and a counter-electrode, to cause plasma discharge. By cleaning the inside of the deposition chamber with the plasma discharge (the reaction gas is $CF_4$, $C_2F_6$, $SF_6$, $H_2$, $NF_3$ or the like), foreign matters attached to the inner wall surface and each constituent member of the deposition chamber at the time of vapor deposition can be removed by etching. Since this can be realized when the film forming apparatus for carrying out vapor growth is used as it is, it is not necessary to take out and clean the constituent members from the deposition chamber. Although the catalyzer can be cleaned at the same time, it may be taken out and separately cleaned outside of the deposition chamber.

In the above-described vapor growth using the catalyzed CVD method according to the present invention, specifically, the catalyzer is heated to a temperature within a range of 800 to 2000° C. and lower than the melting point, for example, by electrifying the catalyzer to heat it by its resistance heating. Reactive species, produced by catalytic reaction or thermal decomposition of at least a part of the reaction gas with the heated catalyzer, are used as material species and a thin film is deposited by a thermal CVD method on the substrate heated to the room temperature to 550° C.

If the heating temperature of the catalyzer is lower than 800° C., the catalytic reaction or thermal decomposition of the reaction gas is insufficient and the deposition rate tends to be lowered. If the heating temperature exceeds 2000° C., the component material of the catalyzer is mixed into the deposited film, thus hindering the electrical property of the film and deteriorating the quality of the film. The beating to the melting point of the catalyzer or higher should be avoided since it causes loss of shape stability. The heating temperature of the catalyzer is preferably lower than the melting point of the component material and 1100 to 1800° C.

The temperature of the substrate is preferably the room temperature to 550° C., and more preferably, 200 to 300° C. for efficient formation of a film of high quality. If the temperature of the substrate exceeds 550° C., inexpensive boro-silicated glass or alumino-silicated glass cannot be used. In forming a passivation film for an integrated circuit, distribution of doping concentration of impurity is easily changed by the influence of heat.

In the case of forming a polysilicon film by the ordinary thermal CVD method, the temperature of the substrate must be approximately 600 to 900° C. In the film forming method according to the present invention, however, it is extremely advantageous that thermal CVD at a low temperature as described above is made possible without requiring plasma or optical excitation. Since a low temperature of the substrate is used at the time of the catalyzed CVD of the present invention as described above, glass such as boro-silicated glass or alumino-silicated glass having a low strain point of 470 to 670° C. can be used as the glass substrate. Such glass is inexpensive, easy to form into a thin plate, and enables formation of a large-size glass plate (1 $m^2$ or greater). It also allows production of an elongated rolled glass plate. For example, a thin film can be continuously or discontinuously on the elongated rolled glass plate by using the above-described technique.

The material gas (i.e., components of the reaction gas) used for vapor growth according to the present invention may be any one of the following gases (a) to (p):

(a) silicon hydride or its derivative;

(b) mixture of silicon hydride or its derivative and gas containing hydrogen, oxygen, nitrogen, germanium, carbon, tin, or lead;

(c) mixture of silicon hydride or its derivative and gas containing impurity made of a group III or group V element of the periodic table;

(d) mixture of silicon hydride or its derivative, gas containing hydrogen, oxygen, nitrogen, germanium, carbon, tin, or lead, and gas containing impurity made of a group III or group V element of the periodic table;

(e) aluminum compound gas;

(f) mixture of aluminum compound gas and gas containing hydrogen or oxygen;

(g) indium compound gas;

(h) mixture of indium compound gas and gas containing oxygen;

(i) fluoride gas, chloride gas or organic compound gas of a refractory metal;

(j) mixture of fluoride-gas, chloride gas or organic compound gas of a refractory metal and silicon hydride or its derivative;

(k) mixture of titanium chloride and gas containing nitrogen and/or oxygen;

(l) copper compound gas;

(m) mixture of aluminum compound gas, hydrogen or hydrogen compound gas, silicon hydride or its derivative, and/or copper compound gas;

(n) hydrocarbon or its derivative;

(o) mixture of hydrocarbon or its derivative and hydrogen gas; and (p) organic metal complex, alkoxide.

As the material gas as described above is used, the following films and the like can be formed by vapor growth: polycrystal silicon; single-crystal silicon; amorphous silicon; microcrystal silicon; compound semiconductors such as gallium-arsenide, gallium-phosphorus, gallium-indium-phosphorus, gallium-nitride and the like; semiconductor thin films of silicon carbide, silicon-germanium and the like; a diamond thin film; an n-type or p-type carrier impurity-containing diamond thin film; a diamond-like carbon thin film; an insulating thin films of silicon oxide, impurity-containing silicon oxides such as phosphorus silicate glass (PSG), boron silicate glass (BSG), boron phosphorus silicate glass (BPSG) and the like, silicon nitride, silicon oxynitride, titanium oxide, tantalum oxide, aluminum oxide and the like; oxidative thin films of indium oxide, indium-tin oxide, palladium oxide and the like; metal thin films of refractory metals such as tungsten, molybdenum, titanium, zirconium and the like, conductive nitride metal, copper, aluminum, aluminum-silicon alloy, aluminum-silicon-copper alloy, aluminum-copper alloy and the like; a thin film having a high dielectric constant such as BST and the like; and thin films and tubular carbon polyhedrons (carbon nano tubes) made of ferroelectrics such as PZT, LPZT, SBT, BIT and the like.

Also, the catalyzer can be made of at least one type of material selected from the group consisting of tungsten, thoria-containing tungsten, molybdenum, platinum, palladium, vanadium, silicon, titanium, alumina, ceramics with metal adhered thereto, and silicon carbide.

It is desired to heat the catalyzer in a hydrogen-based gas atmosphere before supplying the material gas. As the catalyzer is heated before supplying the material gas, the component material of the catalyzer is emitted and may be mixed into the formed film. However, such mixture can be eliminated by heating the catalyzer in the hydrogen-based gas atmosphere. Therefore, it is preferred to heat the catalyzer in the state where the deposition chamber is filled with a hydrogen-based gas and then supply the material gas (so-called reaction gas) using the hydrogen-based gas as a carrier gas.

The present invention is suitable for forming a thin film for a silicon semiconductor device, a silicon semiconductor integrated circuit device, a silicon-germanium semiconductor device, a silicon-germanium semiconductor integrated circuit device, a compound semiconductor device, a compound semiconductor integrated circuit device, a high dielectric memory semiconductor device, a ferroelectric memory semiconductor device, a silicon carbide semiconductor device, a silicon carbide semiconductor integrated circuit device, a liquid crystal display device, an electroluminescence display device, a plasma display panel (PDP) device, a field emission display (FED) device, a light-emitting polymer display device, a light-emitting diode display device, a CCD area/linear sensor device, a MOS sensor device, or a solar battery device.

Specific embodiments of the present invention will now be described in detail.

First Embodiment

A first embodiment of the present invention will be described with reference to FIGS. 1 to 10.

<DC-Bias Catalyzed CVD Method and Device Therefor>

In the present embodiment, on the basis of the catalyzed CVD method, a reaction gas, made of a hydrogen-based carrier gas and a material gas such as a silane gas or the like, is brought in contact with a heated catalyzer made of tungsten or the like, and an electric field of not higher than a glow discharge starting voltage is caused to act on the radical deposition species or its precursor thus produced and radical hydrogen ions, thus providing kinetic energy. Thus, a predetermined film of polycrystal silicon or the like is formed by vapor growth on a substrate. In this case, a DC voltage not higher than the glow discharge starting voltage, that is, a DC voltage determined by the Paschen's law, for example, a voltage not higher than 1 kV is applied between the substrate and a counter-electrode, thus directing the radical deposition species or its precursor and radical hydrogen ions toward the substrate. Hereinafter, the CVD method of the present embodiment is referred to as a DC-bias catalyzed CVD method.

Figure 2:
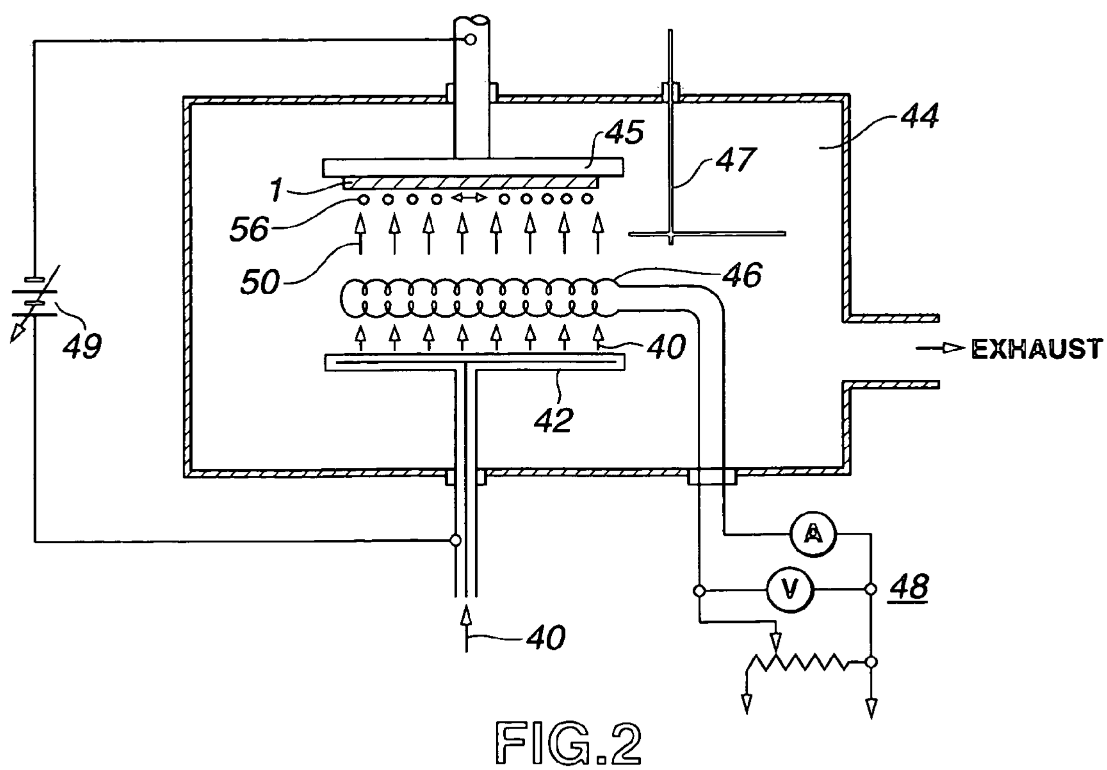
FIG. 2 is a schematic cross-sectional view showing the catalyzed CVD device at the time of CVD.
Figure 3:
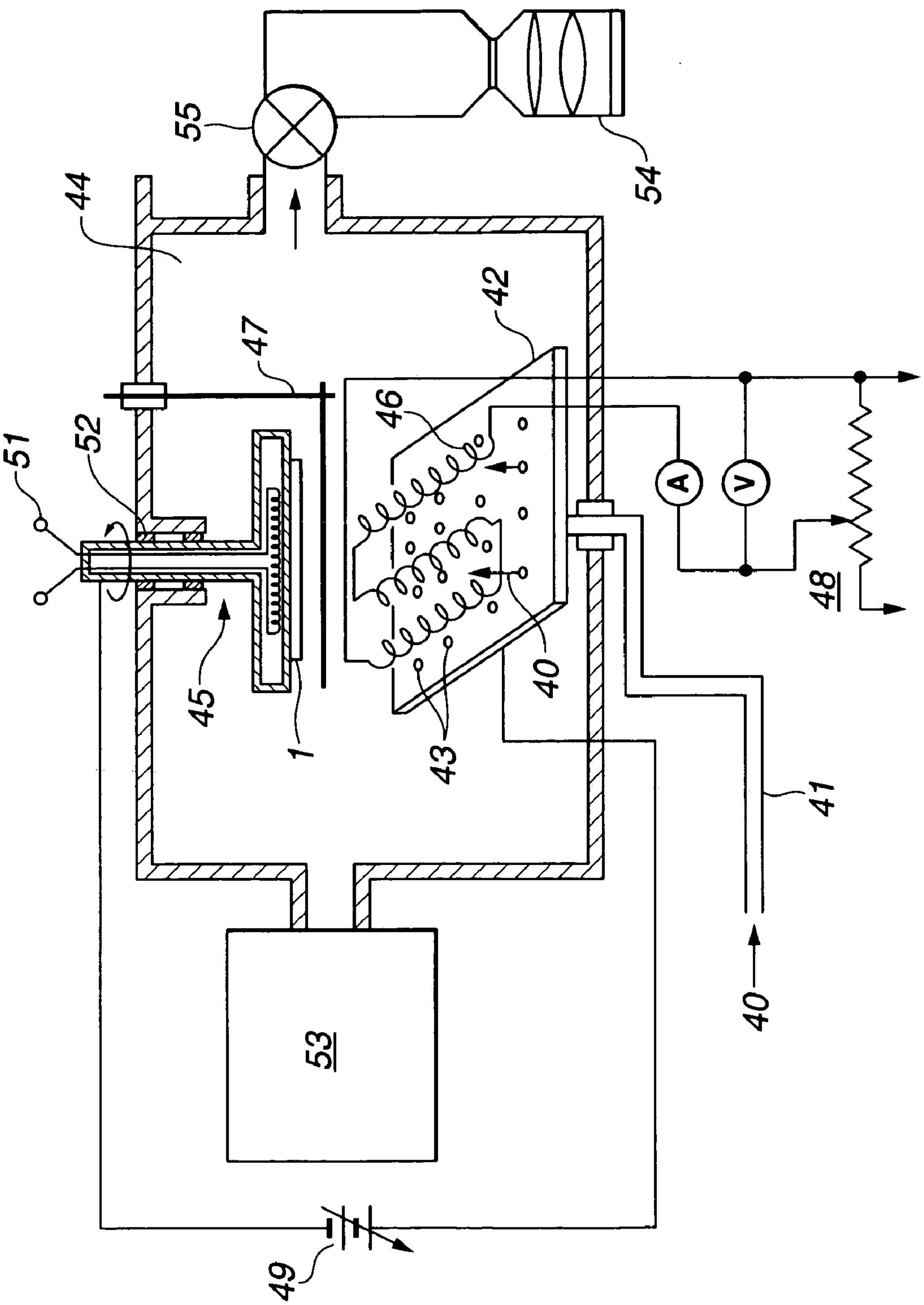
FIG. 3 is a schematic cross-sectional view showing the catalyzed CVD device further in detail.

This DC-bias catalyzed CVD method is carried out using a film forming device as shown in FIGS. 1 to 3.

In this film forming device (DC-bias catalyzed CVD device), a reaction gas, made of a hydrogen-based carrier gas, a material gas 40 of silicon hydride such as mono-silane or the like, and if necessary, a doping gas of $B_2H_6$, $PH_3$ or the like, is fed from a supply duct 41 to a deposition chamber 44 through a supply port 43 of a shower head 42, as shown in FIG. 1. Inside the deposition chamber 44, a suscepter 45 for supporting a substrate 1 made of glass or the like, the shower head 42 having high heat resistance property and made of a material preferably having the same melting point as a catalyzer 46 or higher, the coil-shaped catalyzer 46 made of tungsten or the like, and a shutter 47 that can be open/closed are arranged, as shown in FIG. 2. A magnetic seal 52 is provided between the suscepter 45 and the deposition chamber 44. The deposition chamber 44 is connected to the end of a previous chamber 53 for carrying: out a previous step, and is exhausted via a valve 55 by a turbo-molecular pump 54 or the like, as shown in FIG. 3.

As shown in FIG. 3, the substrate 1 is heated by heating means such as a heater wire 51 in the suscepter 45, and the catalyzer 46 is heated for activation to a temperature not higher than the melting point, particularly 800 to 2000° C., as a resistance wire, and approximately 1600 to 1700° C. in the case of tungsten. Both terminals of the catalyzer 46 are connected to a DC or AC catalyzer power source 48 and are heated to a predetermined temperature by electrification from the power source. The shower head 42 is connected as an accelerating electrode to the positive electrode side of a variable DC power source (not higher than 1 kV, for example, 500 V) 49 through the duct 41, and a DC-bias voltage not higher than 1 kV is applied between the shower head 42 and the susceptor 45 supporting the substrate 1 on the negative electrode side.

To carry out the DC-bias catalyzed CVD method, the degree of vacuum in the deposition chamber 44 is set at $10^{-6}$ to $10^{-8}$ Torr, and the hydrogen-based carrier gas is supplied at 100 to 200 SCCM (standard cc per minute). After the catalyzer is heated to a predetermined temperature for activation, the reaction gas 40 made of the silicon hydride (e.g., mono-silane) gas at 1 to 20 SCCM (including an appropriate quantity of the doping gas made of $B_2H_6$, $PH_3$ or the like, if necessary) is fed from the supply duct 41 through the supply port 43 of the shower head 42, and the gas pressure is set at $10^{-1}$ to $10^{-3}$ Torr, for example, $10^{-2}$ Torr. The hydrogen-based carrier gas may be any gas that is produced by mixing an appropriate quantity of inert gas with hydrogen, for example, hydrogen, hydrogen+argon, hydrogen+helium, hydrogen +neon, hydrogen+xenon, hydrogen+krypton or the like. (This applies throughout the following description.) The hydrogen-base carrier gas is not necessarily required, depending on the type of the material gas. That is, there is known a method for forming polysilicon by catalytic reaction of silane alone without using the hydrogen-based carrier gas (known as a hot wire method), and the present invention can also apply to this method.

At least a part of the reaction gas 40 contacts the catalyzer 46 and is catalytically decomposed, thus forming a group of reactive species including ions and radicals such as silicon having high energy, that is, deposition species or their precursors and radical hydrogen ions, by catalytic decomposition or thermal decomposition reaction. A DC field from the DC power source 49 of a voltage not higher than the glow discharge starting voltage (about 1 kV), for example, 500 V, is caused to act on the resultant reactive species 50 including ions and radicals so as to provide kinetic energy, thereby directing the reactive species toward the substrate 1. Thus, a predetermined film of polycrystal silicon or the like is formed by vapor growth on the substrate 1 which is held at the room temperature to 550° C. (e.g., 200 to 300° C.).

Since the reactive species are thus provided with the catalytic action of the catalyzer 46 and with the directional kinetic energy which is obtained by adding the acceleration energy due to the DC field to the thermal energy of the catalytic action without generating plasma, the reaction gas can be efficiently changed to the reactive species, which can be uniformly deposited on the substrate 1 by thermal CVD using the DC field. Since these deposition species 56 migrate on the substrate 1 and are diffused in the thin film, a minute, flat and uniform thin film having high step coverage can be formed.

Thus, in the DC-bias catalyzed CVD of the present embodiment, the production of the thin film is controlled by the independent, arbitrary DC field, in comparison with the temperature of the substrate, the temperature of the catalyzer, the gas pressure (the flow rate of the reaction gas), the type of the material gas or the like as control factors of the conventional catalyzed CVD. Therefore, the tight contact between the produced film and the substrate, the density of the produced film, the uniformity or smoothness of the produced film, burying into a via-hole or the like, and the step coverage are improved and the temperature of the substrate is lowered further to enable stress control of the produced film. Thus, a film of high quality, for example, a silicon film or metal film having a bulk-like property, can be provided. In addition, since the reactive species produced by the catalyzer 46 can be independently controlled by the DC field and efficiently deposited on the substrate, it is possible to realize higher utilization efficiency of the reaction gas, a higher production speed, improvement in productivity, and reduction in cost due to reduction in the quantity of the reaction gas.

Since the deposition species have large kinetic energy even when the temperature of the substrate is lowered, an intended film of good quality is obtained. Therefore, the temperature of the substrate can be lowered further as described above and an insulating substrate such as a glass substrate made of boro-silicate glass, alumino-silicate glass or the like, or a heat-resistant resin substrate made of polyimide or the like can be used. It is again possible to realize reduction in cost. In addition, since the shower head 42 for supplying the reaction gas can be also used as the electrode for accelerating the reactive species, a simple structure may be employed.

Moreover, since no plasma is generated, a film having no damage due to plasma and with low stress can be provided and a device which is more simple and inexpensive than in the plasma CVD method can be realized.

In this case, though operation can be done under a reduced pressure (e.g., $10^{-3}$ to $10^{-2}$ Torr) or under a normal pressure, an apparatus of normal-pressure type is more simple and inexpensive than an apparatus of reduced-pressure type. Since the above-described electric field is applied in the normal-pressure type, too, a film of high quality having excellent density, uniformity and tight contact is provided. In this case, too, the normal-pressure type realizes a greater throughput, higher productivity and greater reduction in cost than the reduced-pressure type.

In the case of the reduced-pressure type, the DC voltage is affected by the gas pressure (the flow rate of the reaction gas) and the type of the material gas. In any case, it is necessary to adjust the DC voltage to an arbitrary voltage not higher than the glow discharge starting voltage. In the case of the normal-pressure type, though there is no discharge, it is desired to adjust the exhaust gas flow so as not to contact the substrate, in order to prevent the flow of the material gas and reactive species from adversely affecting the thickness and quality of the film.

In the above-described CVD, though the temperature of the substrate is increased by heat radiation from the catalyzer 46, the substrate heater 51 may be installed as described above, if necessary. While the catalyzer 46 may be in the shape of a coil, mesh, wire or porous plate, it is preferred to provide the catalyzer in a plurality of stages, for example, two to three stages, in the direction of the gas flow so as to increase the contact area with the gas. In this CVD, since the substrate 1 is set on the lower surface of the susceptor 45 and thus arranged above the shower head 42, no particle generated in the deposition chamber 44 will fall and adhere to the substrate 1 and the film thereon.

Figure 4:
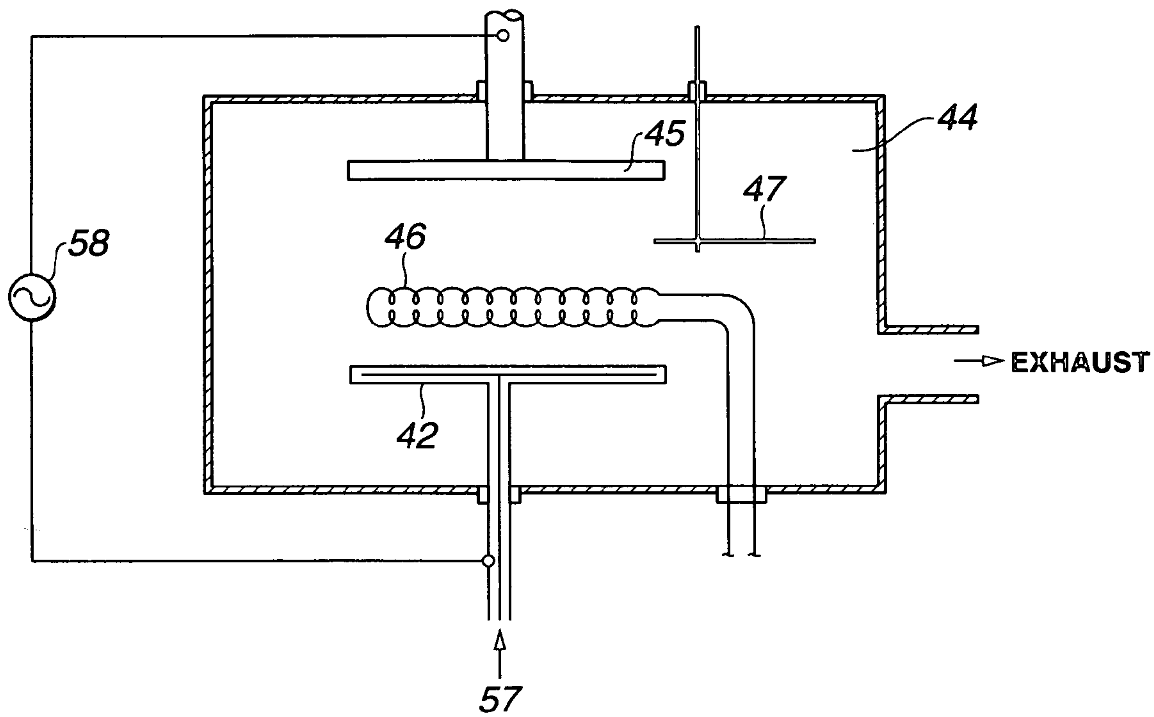
FIG. 4 is a schematic cross-sectional view showing the catalyzed CVD device at the time of cleaning.

In the present embodiment, after the above-described DC-bias catalyzed CVD is carried out, the substrate 1 is taken out of the deposition chamber 44 and a reaction gas 57 of $CF_4$, $C_2F_6$, $SF_6$, $H_2$, $NF_3$ or the like (with the degree of vacuum equal to $10^{-2}$ to several Torr) is fed, as shown in FIG. 4. Then, a high-frequency voltage 58 or a DC voltage is applied between the susceptor 45 of the substrate 1 and the shower head 42 as the counter-electrode, thereby causing plasma discharge. Thus, the inside of the deposition chamber 44 can be cleaned. The plasma-generating voltage in this case is not lower than 1 kV, particularly, several kV to tens of kV, for example, 10 kV.

Specifically, the foreign matters attached to the inner wall surface of the deposition chamber 44 and the respective constituent members such as the suscepter 45, the shower head 42, the shutter 47 and the catalyzer 46 at the time of vapor growth can be removed by etching. Since this can be realized when the film forming apparatus for carrying out vapor growth is used as it is, it is not necessary to take out and clean the constituent members from the deposition chamber 44. Although the catalyzer 46 can be cleaned at the same time (with the catalyzer power source 46 being off), it may be taken out and separately cleaned outside of the deposition chamber 44.

<Manufacture of MOSTFT>

An example of manufacture of a MOSTFT using the DC-bias catalyzed CVD method of the present embodiment will now be described.

Figure 5A:
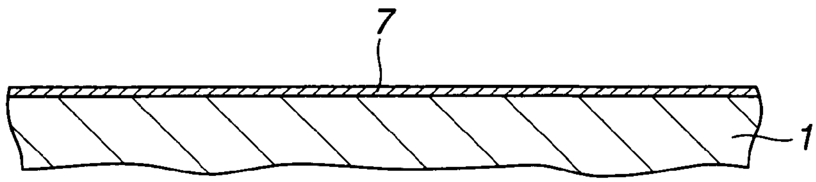
FIGS. 5A to 5K are cross-sectional views showing a manufacturing process for an MOSTFT using the catalyzed CVD device, in the order of process steps.

Using the film forming device shown in FIGS. 1 to 3, a polycrystal silicon film 7 with a thickness of several μm to 0.005 μm, for example 0.1 μm, is grown on one major surface of a heat-resistant insulating substrate 1 made of quartz glass or crystalline glass (with a strain point of approximately 800 to 1400° C. and a thickness of 50 micron to several mm) by the above-described DC-bias catalyzed CVD method, as shown in FIG. 5A. The temperature of the substrate is the room temperature to 550° C., for example, 200 to 300° C., and the gas pressure is $10^{-1}$ to $10^{-3}$ Torr, for example, $10^{-2}$ Torr.

In this case, the degree of vacuum in the deposition chamber 44 is set to $10^{-6}$ to $10^{-8}$ Torr, and the hydrogen-based carrier gas is supplied at 100 to 200 SCCM. After the catalyzer is heated to a predetermined temperature for activation, the reaction gas 40 made of the silicon hydride (e.g., mono-silane) gas at 1 to 20 SCCM (including an appropriate quantity of the doping gas made of $B_2H_6$, $PH_3$ or the like, if necessary) is fed from the supply duct 41 through the supply port 43 of the shower head 42, and the gas pressure is set at $10^{-1}$ to $10^{-3}$ Torr, for example, $10^{-2}$ Torr. The hydrogen-based carrier gas may be any of hydrogen, hydrogen+argon, hydrogen+neon, hydrogen+helium, hydrogen+xenon, hydrogen+krypton or the like.

The substrate 1 is heated from the room temperature to 550° C., for example, 200 to 300° C., by the heater wire 51 in the suscepter 45, and the catalyzer 46 is heated for activation to a temperature not higher than the melting point, particularly 800 to 2000 C., as a resistance wire in the hydrogen-based carrier gas, for example, by heating a tungsten wire to approximately 1650° C. for activation. The reaction gas 40 is brought in contact with the heated catalyzer 46 of tungsten or the like, and the shutter 47 is opened.

At least a part of the reaction gas 40 contacts the catalyzer 46 and is catalytically decomposed, thus forming a group of silicon ions having high energy and radical hydrogen ions, that is, radical deposition species or their precursors and radical hydrogen ions, by catalytic decomposition or thermal decomposition reaction. A DC field from the DC power source 49 of a voltage not higher than the glow discharge starting voltage, for example, 500 V, is caused to act on the resultant reactive species 50 including ions and radicals so as to provide kinetic energy, thereby directing the reactive species toward the substrate 1. Thus, the polycrystal silicon film 7 is formed by vapor growth on the substrate 1 which is held at the room temperature to 550° C., for example, 200 to 300° C.

The polycrystal silicon film 7 with a thickness of approximately 0.1 μm is thus deposited. The deposition time is calculated from the thickness of the film to be grown. After the end of growth, the supply of the material gas is stopped. The hydrogen-based carrier gas is stopped after the temperature of the catalyzer is lowered. Then, the atmospheric pressure is restored and the substrate 1 is taken out. In this case, it is important to use the hydrogen-based carrier gas atmosphere during the rise and fall of the temperature of the catalyzer in order to prevent oxidation and deterioration of the catalyzer.

Next, a MOS transistor (TFT) using the polycrystal silicon layer 7 as a channel region is produced.

Figure 5B:
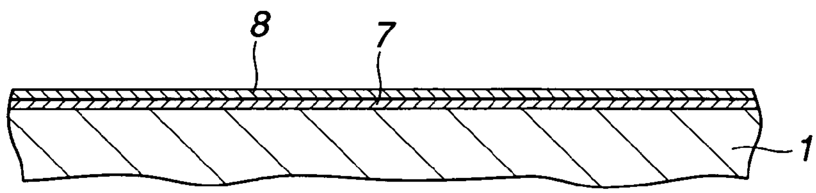

Specifically, as shown in FIG. 5B, a gate oxide film 8 with a thickness of 350 Å is formed on the surface of the polycrystal silicon film 7 by the DC-bias catalyzed CVD method as described above, during the thermal oxidation at 950° C., or during the supply of an oxygen gas diluted with a helium gas or the supply of a mono-silane gas. In the case of forming the gate oxide film 8 by the DC-bias catalyzed CVD method, the temperature of the substrate, the temperature of the catalyzer and the DC-bias voltage are similar to those described above. However, the flow rate of the oxygen gas diluted with the helium gas may be 1 to 2 SCCM, and the flow rate of the mono-silane gas may be 20 SCCM. The flow rate of the hydrogen-based carrier gas may be 150 SCCM.

Figure 5C:
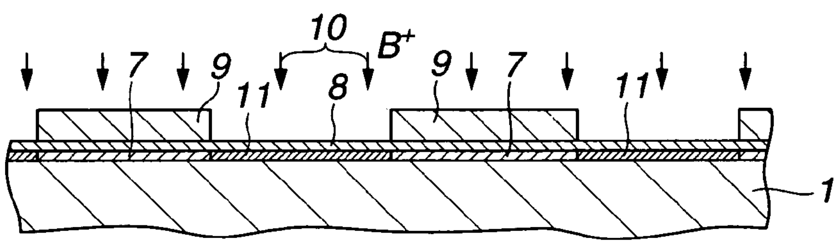

Then, for controlling the concentration of the impurity in the channel region of the N-channel MOS transistor, the P-channel MOS transistor portion is masked by a photoresist 9, and P-type impurity ions, for example, $B^{+}10$, in a dosage of $2.7\times10^{12}$ atoms/cm$^2$ are implanted at 30 keV, thereby changing the conductivity of the polycrystal silicon film 7 to P-type so as to form a P-type polycrystal silicon film 11, as shown in FIG. 5C.

Figure 5D:
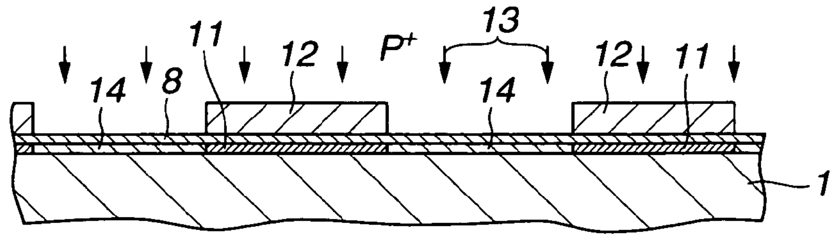

Then, for controlling the concentration of the impurity in the channel region of the P-channel MOS transistor, the N-channel MOS transistor portion is masked by a photoresist 12, and N-type impurity ions, for example, $P^{+}$ 13, in a dosage of $1\times10^{12}$ atoms/cm$^2$ are implanted at 50 keV, thereby compensating the P-type of the polycrystal silicon film 7 so as to form a polycrystal silicon film 14, as shown in FIG. 5D.

Figure 5E:
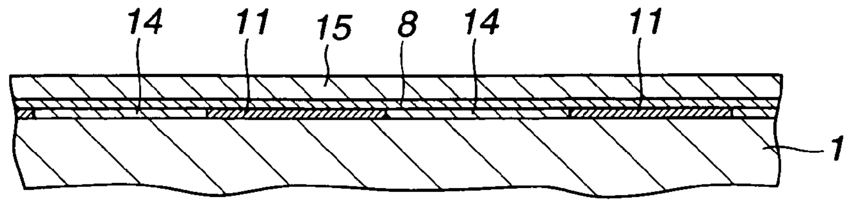

Next, a phosphorus-doped polycrystal silicon film 15 as a gate electrode material with a thickness of 4000 Å is deposited by the DC-bias catalyzed CVD method (with the temperature of the substrate equal to 200 to 300° C.), during the supply of $PH_3$ at 2 to 20 SCCM and the mono-silane gas at 20 SCCM, as shown in FIG. 5E.

Figure 5F:
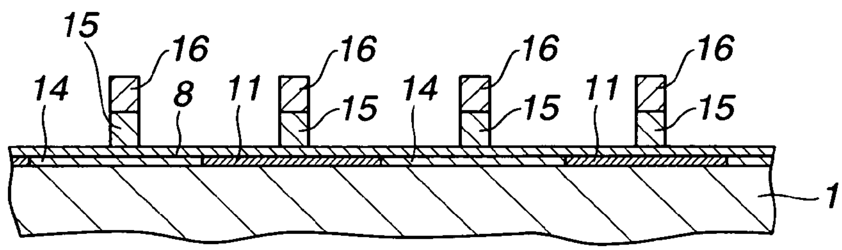
Figure 5G:
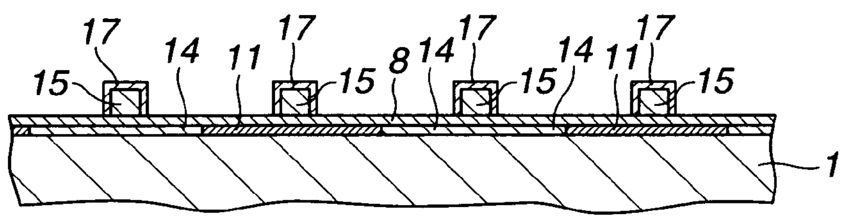

Then, a photoresist 16 is formed in a predetermined pattern, and using this photoresist 16 as a mask, the polycrystal silicon film 15 is patterned into the shape of the electrode, as shown in FIG. 5F. In addition, after the photoresist 16 is removed, an oxide film 17 is formed on the surface of the gate polycrystal silicon film 15 by oxidation at 900° C. for 60 minutes in an $O_2$ atmosphere, as shown in FIG. 5G.

Figure 5H:
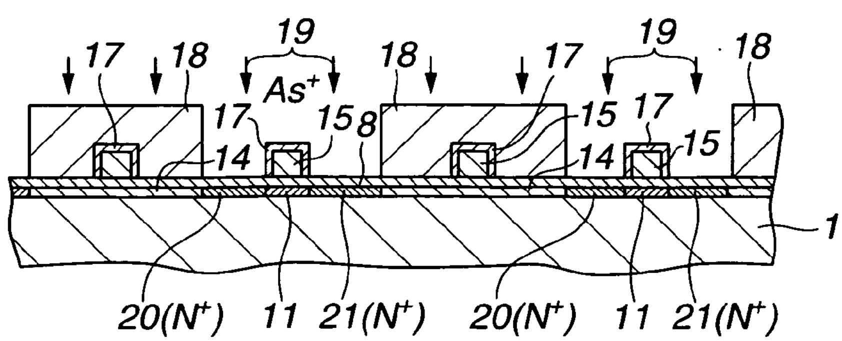

Next, as shown in FIG. 5H, the P-channel MOS transistor portion is masked by a photoresist 18, and $As^{+}$ ions 19 as N-type impurity in a dosage of $5\times10^{15}$ atoms/cm$^2$ are implanted at 80 keV. By annealing at 950° C. for five minutes in a $N_2$ atmosphere, an $N^{+}$-type source region 20 and a drain region 21 of the N-channel MOS transistor are formed.

Then, as shown in FIG. 5I, the N-channel MOS transistor portion is masked by a photoresist 22, and $B^+$ ions 23 as P-type impurity in a dosage of $5\times10^{15}$ atoms/cm$^2$ are implanted at 30 keV. By annealing at 950° C. for five minutes in a $N_2$ atmosphere, a $P^+$-type source region 24 and a drain region 25 of the P-channel MOS transistor are formed.

Figure 5:
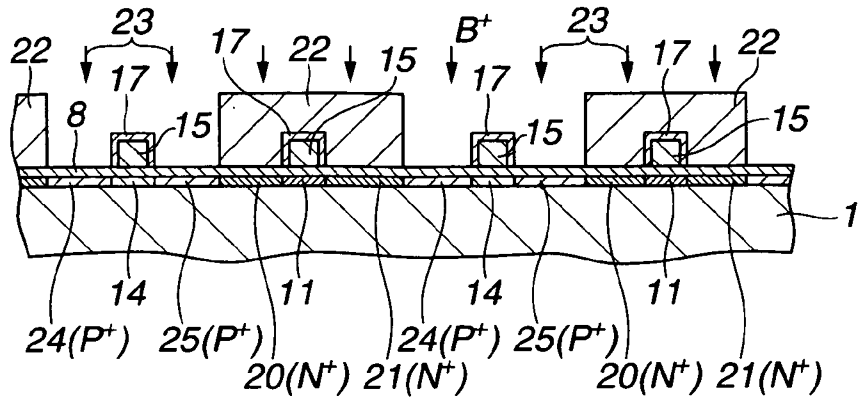
Figure 5J:
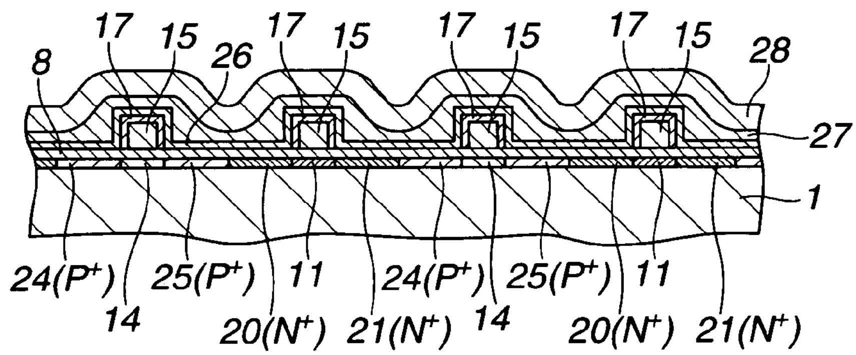

By the DC-bias catalyzed CVD method as described above, a $SiO_2$ film 26 with a thickness of 500 Å at 200° C. during the supply of $O_2$ diluted with a helium gas at 1 to 2 SCCM and the supply of $SiH_4$ at 15 to 20 SCCM, and a SiN film 27 with a thickness of 2000 Å at 200° C. during the supply of $NH_3$ at 50 to 60 SCCM and the supply of $SiH_4$ at 15 to 20 SCCM, are stacked on the entire surface using the hydrogen-based carrier gas at 150 SCCM as a common carrier gas, as shown in FIG. 5J. In addition, during the supply of $B_2H_6$ at 1 to 20 SCCM, $PH_3$ at 1 to 20 SCCM, $O_2$ diluted with helium at 1 to 2 SCCM and $SiH_4$ at 15 to 20 SCCM, a boron- and phosphorus-doped silicate glass (BPSG) film 28 with a thickness of 6000 Å at 200° C. is formed as a reflow film, and the reflow of the BPSG film 28 is carried out at 900° C. in an $N_2$ atmosphere.

Figure 5K:
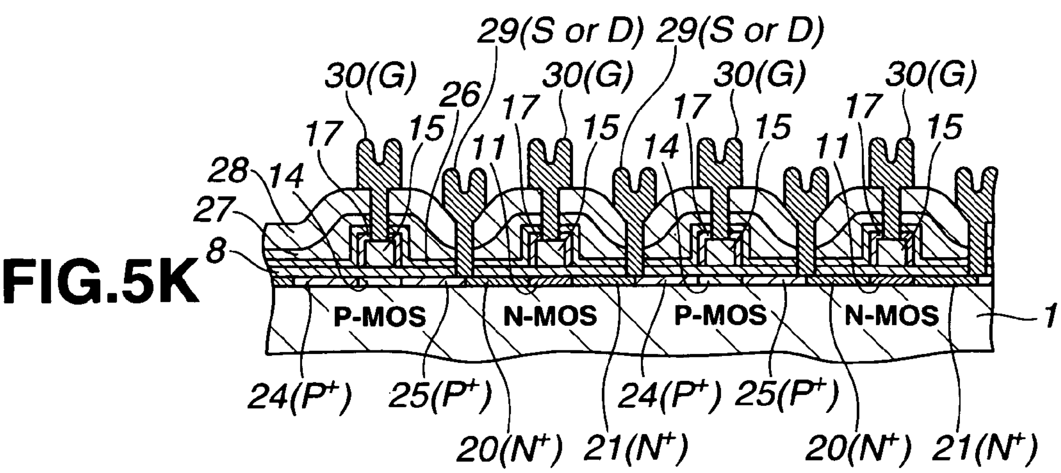

As shown in FIG. 5K, a contact window is opened at a predetermined position on the above-described insulation film, and an electrode material such as aluminum with a thickness of 1 μm at 150° C. is deposited on the entire surface including each contact hole by a sputtering method or the like. The deposited material is patterned to form a source or drain electrode 29 (S or D) and a gate lead-out electrode or wiring 30 of the P-channel MOSTFT and N-channel MOSTFT, thus forming each MOS transistor of a top gate type. In this process, an aluminum film may be formed by the DC-bias catalyzed CVD method of the present invention.

<Manufacture of LCD>

An example of manufacture of a liquid crystal display device (LCD) using the DC-bias catalyzed CVD method of the present embodiment will now be described.

Figures 6A, 6B, 6C, 6D:
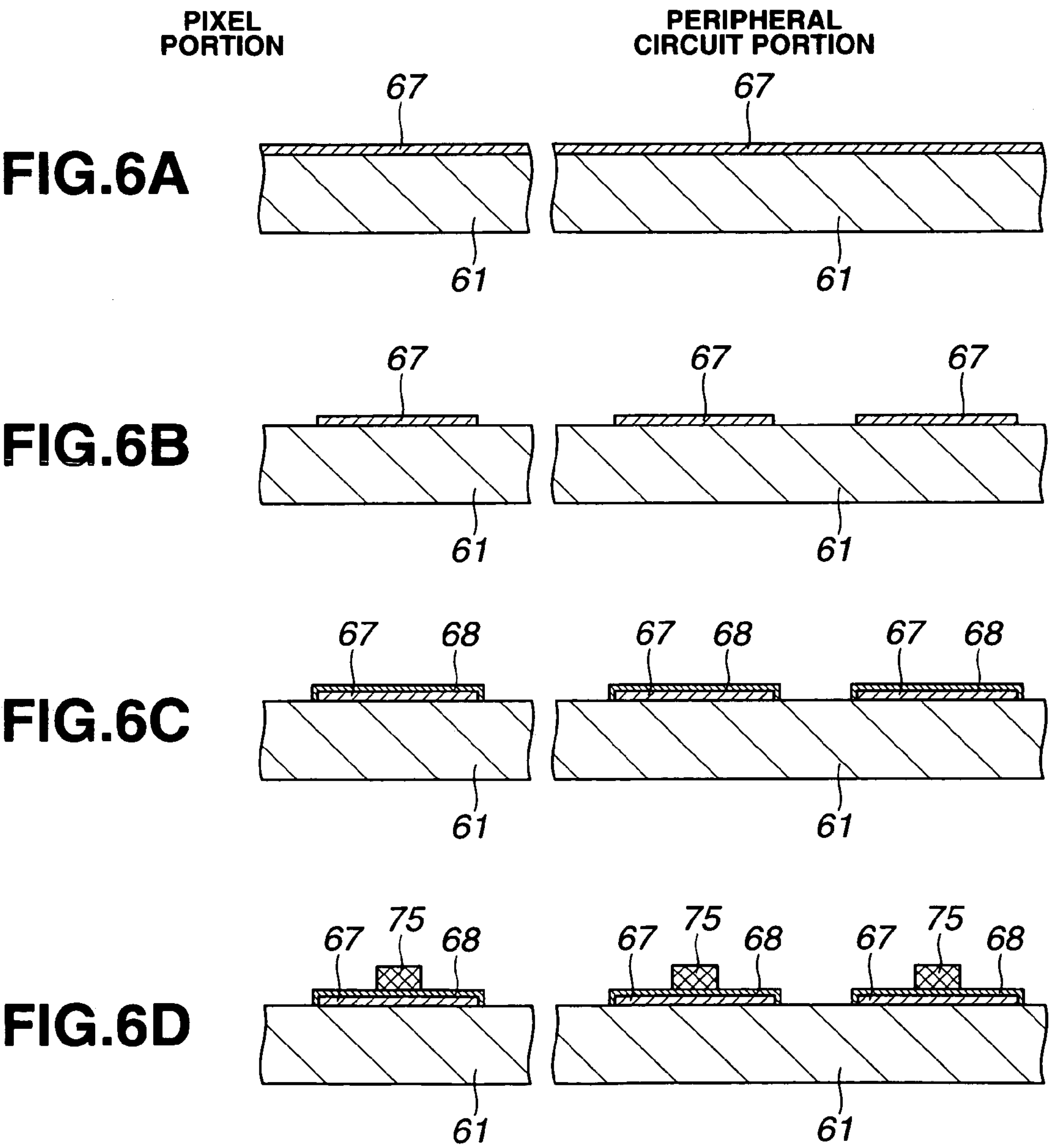
FIGS. 6A to 6I are cross-sectional views showing a manufacturing process for an LCD using the catalyzed CVD device, in the order of process steps.

Using the film forming device shown in FIGS. 1 to 3, a polycrystal silicon film 67 with a thickness of several μm to 0.005 μm, for example 0.1 μm, is grown on one major surface of a heat-resistant insulating substrate 1 made of quartz glass or crystalline glass (with a strain point of approximately 800 to 1400° C. and a thickness of 50 micron to several mm) in a pixel portion and a peripheral circuit portion by the above-described DC-bias catalyzed CVD method (with the temperature of the substrate equal to the room temperature to 550° C., for example, 400° C., and the gas pressure equal to $10^{-1}$ to $10^{-3}$ Torr, for example, $10^{-2}$ Torr), as shown in FIG. 6A.

In this case, the degree of vacuum in the deposition chamber 44 is set to $10^{-6}$ to $10^{-8}$ Torr, and the hydrogen-based carrier gas is supplied at 100 to 200 SCCM. After the catalyzer is heated to a predetermined temperature for activation, the reaction gas 40 made of the silicon hydride (e.g., mono-silane) gas at 1 to 20 SCCM (including an appropriate quantity of the doping gas made of $B_2H_6$, $PH_3$ or the like, if necessary) is fed from the supply duct 41 through the supply port 43 of the shower head 42, and the gas pressure is set at $10^{-1}$ to $10^{-3}$ Torr, for example, $10^{-2}$ Torr. The hydrogen-based carrier gas may be any of hydrogen, hydrogen+argon, hydrogen+neon, hydrogen+helium, hydrogen+xenon, hydrogen+krypton or the like.

The substrate 1 is heated to the room temperature to 550° C., for example, 200 to 300° C., by the heater wire 51 in the suscepter 45, and the catalyzer 46 is heated for activation to a temperature not higher than the melting point, particularly 800 to 2000° C., as a resistance wire in the hydrogen-based carrier gas, for example, by heating a tungsten wire to approximately 1650° C. for activation. The reaction gas 40 is brought in contact with the heated catalyzer 46 of tungsten or the like, and the shutter 47 is opened.

At least a part of the reaction gas 40 contacts the catalyzer 46 and is catalytically decomposed, thus forming a group of silicon ions having high energy and radical hydrogen ions, that is, radical deposition species or their precursors and radical hydrogen ions, by catalytic decomposition or thermal decomposition reaction. A DC field from the DC power source 49 of a voltage: not higher than the glow discharge starting voltage, for example, 500 V, is caused to act on the resultant reactive species 50 including ions and radicals so as to provide kinetic energy, thereby directing the reactive species toward the substrate 1. Thus, the polycrystal silicon film 67 is formed by vapor growth on the substrate 1 which is held at the room temperature to 550° C., for example, 200 to 300° C.

The polycrystal silicon film 67 with a thickness of approximately 0.1 μm is thus deposited. The deposition time is calculated from the thickness of the film to be grown. After the end of growth, the supply of the material gas is stopped. The hydrogen-based carrier gas is stopped after the temperature of the catalyzer is lowered. Then, the atmospheric pressure is restored and the substrate 1 is taken out. In this case, it is important to use the hydrogen-based carrier gas atmosphere during the rise and fall of the temperature of the catalyzer in order to prevent oxidation and deterioration of the catalyzer.

Next, the polycrystal silicon film 67 is patterned using a photoresist mask, thereby forming a transistor active layer of each portion, as shown in FIG. 6B.

Then, as shown in FIG. 6C, a gate oxide film 68 with a thickness of 350 Å is formed on the surface of the polycrystal silicon film 67 by the DC-bias catalyzed CVD method as described above, during the thermal oxidation at 950° C., or during the supply of an oxygen gas diluted with a helium gas or the supply of a mono-silane gas. In the case of forming the gate oxide film 68 by the DC-bias catalyzed CVD method, the temperature of the substrate, the temperature of the catalyzer and the DC-bias voltage are similar to those described above. However, the flow rate of the oxygen gas diluted with the helium gas may be 1 to 2 SCCM, and the flow rate of the mono-silane gas may be 15 to 20 SCCM. The flow rate of the hydrogen-based carrier gas may be 150 SCCM.

After ion implantation of predetermined impurity such as $B^+$ or $P^+$ as described above is carried out for controlling the concentration of the impurity in the channel region of the transistor active layer 67, aluminum with a thickness of 4000 Å is deposited as a gate electrode material by sputtering, or a phosphorus-doped polycrystal silicon film as a gate electrode material with a thickness of 4000 Å is deposited by the DC-bias catalyzed CVD method (with the temperature of the substrate equal to 200 to 300° C.), during the supply of the hydrogen-based carrier gas at 150 SCCM, $PH_3$ at 2 to 20 SCCM and the mono-silane gas at 20 SCCM, as shown in FIG. 6D. Then, using a photoresist mask, the gate electrode material layer is patterned into the shape of a gate electrode 75. After the photoresist mask is removed, an oxide film may be formed on the surface of the gate polycrystal silicon film 75 by oxidation at 900° C. for 60 minutes in an $O_2$ atmosphere.

Figure 6E:
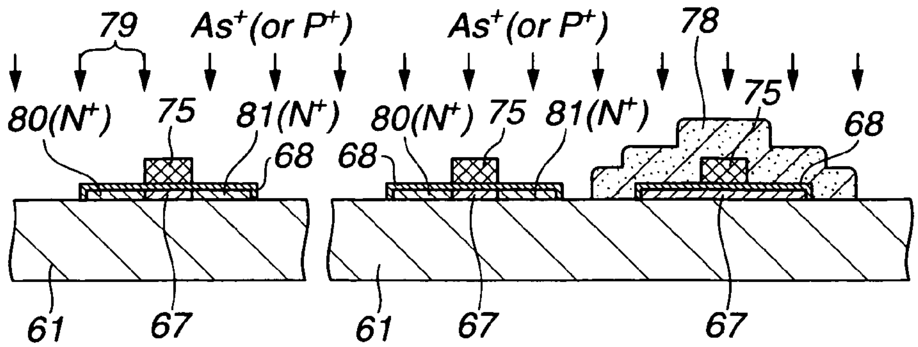

Then, as shown in FIG. 6E, the P-channel MOS transistor portion is masked by a photoresist 78, and $As^+$ or $P^+$ ions 79 as N-type impurity ions in a dosage of $1\times10^{15}$ atoms/$cm^2$ are implanted at 80 keV. By annealing at 950° C. for five minutes in a $N_2$ atmosphere, an $N^+$-type source region 80 and a drain region 81 of the N-channel MOS transistor are formed.

Figure 6F:
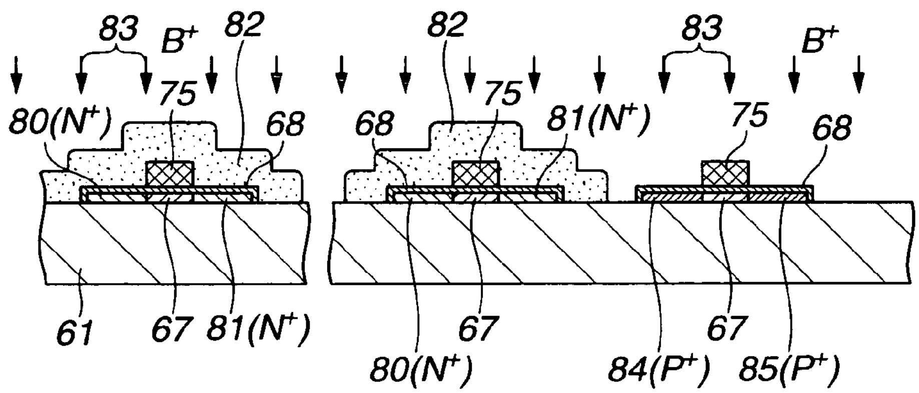

Then, as shown in FIG. 6F, the N-channel MOS transistor portion is masked by a photoresist 82, and $B^+$ ions 83 as P-type impurity in a dosage of $5\times10^{15}$ atoms/$cm^2$ are implanted at 30 keV. By annealing at 950° C. for five minutes in a $N_2$ atmosphere, a $P^+$-type source region 84 and a drain region 85 of the P-channel MOS transistor are formed.

Figure 6G:
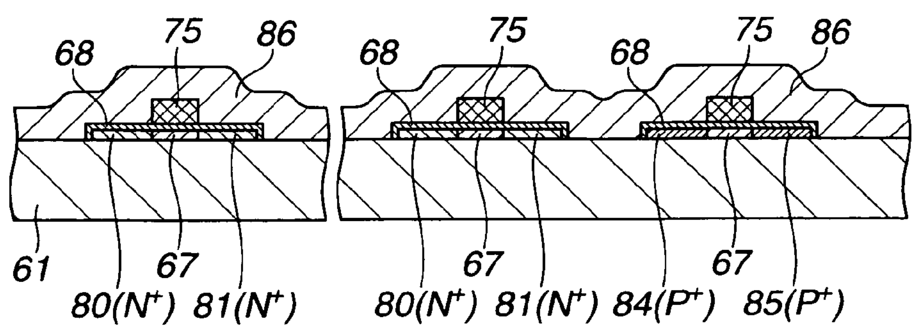

By the DC-bias catalyzed CVD method as described above, a $SiO_2$ film with a thickness of 500 Å at 200° C. during the supply of $O_2$ diluted with He at 1 to 2 SCCM and the supply of $SiH_4$ at 15 to 20 SCCM, and a SiN film with a thickness of 2000 Å at 200° C. during the supply of $NH_3$ at 50 to 60 SCCM and the supply of $SiH_4$ at 15 to 20 SCCM, are stacked on the entire surface using the hydrogen-based carrier gas at 150 SCCM as a common carrier gas, as shown in FIG. 6G. In addition, during the supply of $B_2H_6$ at 1 to 20 SCCM, $PH_3$ at 1 to 20 SCCM, $O_2$ diluted with He at 1 to 2 SCCM and $SiH_4$ at 15 to 20 SCCM, a boron- and phosphorus-doped silicate glass (BPSG) film with a thickness of 6000 Å at 200° C. is formed as a reflow film, and the reflow of this BPSG film is carried out at 900° C. in an $N_2$ atmosphere. These insulation films are stacked to form an interlayer insulation film 86. Such interlayer insulation film may also be formed by a method different from the above-described method, for example, by a plasma CVD method.

Figure 6H:
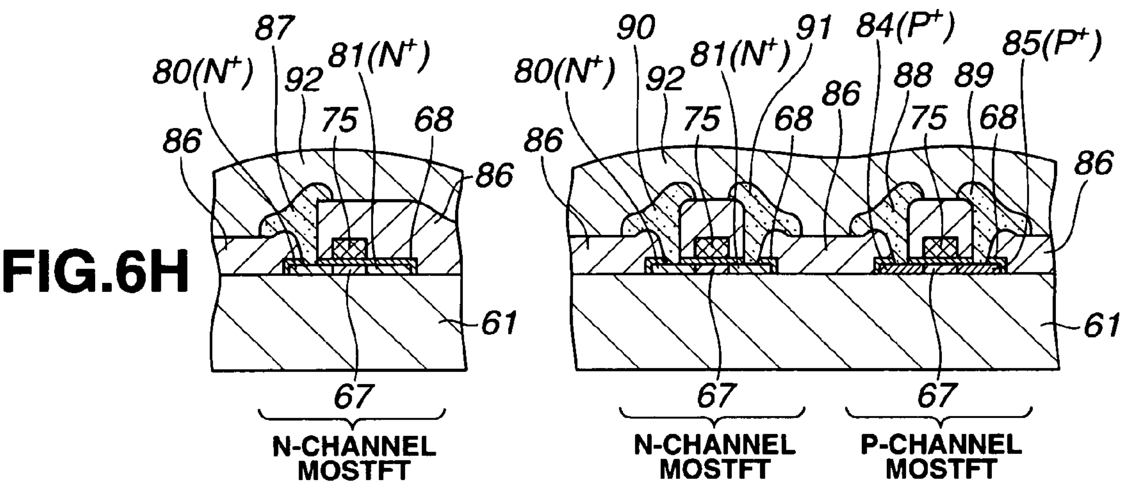

As shown in FIG. 6H, a contact window is opened at a predetermined position on the above-described insulation film 86, and an electrode material such as aluminum with a thickness of 1 $\mu$m at 150° C. is deposited on the entire surface including each contact hole by a sputtering method or the like. The deposited material is patterned to form a source electrode 87 of the N-channel MOSTFT of the pixel portion, and source electrodes 88, 90 and drain electrodes 89, 91 of the P-channel MOSTFT and the N-channel MOSTFT of the peripheral circuit portion. In this process, an aluminum film may be formed by the DC-bias catalyzed CVD method of the present invention.

After an interlayer insulation film 92 of $SiO_2$ is formed on the surface by the CVD method, a contact hole is opened in the interlayer insulation films 92 and 86 of the pixel portion, as shown in FIG. 6I. Then, indium tin oxide (ITO: a transparent electrode material produced by doping indium oxide with tin) is deposited on the entire surface by a vacuum evaporation method, and is patterned to form a transparent pixel electrode 93 connected to the drain region 81. Thus, a transmission LCD can be produced. The above-described process is similarly applicable to the manufacture of a reflection LCD.

Second Embodiment

A second embodiment of the present invention will now be described with reference to FIG. 7.

Figure 7:
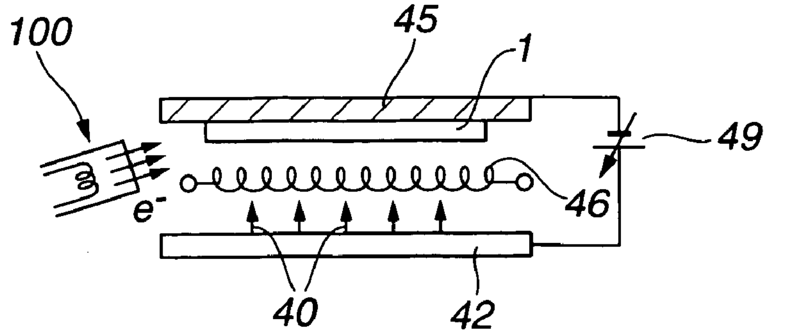
FIG. 7 is a schematic cross-sectional view showing essential parts of a DC-bias catalyzed CVD device according to a second embodiment of the present invention.

In the present embodiment, using the DC-bias catalyzed CVD method and the device therefor of the first embodiment, charged particles or ions are provided, that is, an electron shower 100 is provided near a substrate 1 or a suscepter 45 as shown in FIG. 7. Therefore, in addition to the effect of the first embodiment, an excellent effect can be realized as follows.

At the time of or during the formation of the above-described polycrystal silicon film, radical deposition species of high energy or their precursors and ions might be generated in the reaction gas due to catalytic action of a catalyzer 46, and charge up the substrate 1, thus causing unevenness in the film formation and deterioration in the performance of the film or device. However, by irradiating the ions and the like with electrons having directionality and concentration due to a DC field from the electron shower 100, the charges on the substrate 1 can be neutralized to enable satisfactory prevention of the charge-up. Particularly, when the substrate 1 is made of an insulation material, electric charges tend to be accumulated. Therefore, the use of the electron shower 100 turns out to be effective.

Third Embodiment

A third embodiment of the present invention will now be described with reference to FIG. 8.

Figure 8:
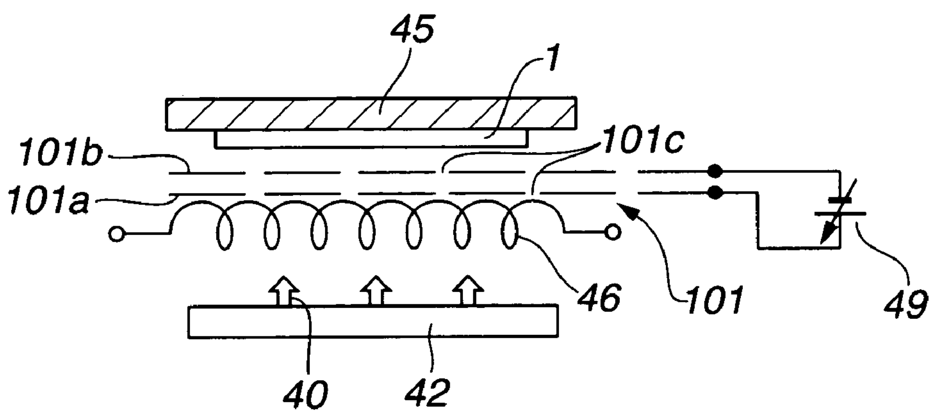
FIG. 8 is a schematic cross-sectional view showing essential parts of a DC-bias catalyzed CVD device according to a third embodiment of the present invention.

In the present embodiment, a mesh electrode 101 for accelerating reactive species is provided between a substrate 1 and a catalyzer 46 as shown in FIG. 8, in the DC-bias catalyzed CVD method and the device therefor of the first embodiment.

Specifically, a plurality of mesh electrodes 101*a* and 101*b* having gas passage holes 101*c* are provided between the substrate 1 and the catalyzer 46, and a DC voltage 49 not higher than 1 kV is applied between them, thereby providing kinetic energy in the direction toward the substrate 1 to the reactive species generated by decomposition of the reaction gas due to the catalyzer 46 as described above. Therefore, in addition to the effect similar to that of the first embodiment, an accelerating electrode which is designed and processed in advance can be easily inserted as the mesh electrode 101 into the gap between the substrate 1 and the catalyzer 46, and the accelerating electrode can be arranged after it is processed into a shape for improving the acceleration efficiency. It is desired that the mesh electrode 101 and the shower head 42 are made of a material having high heat resistance property, and preferably having the same melting point as that of the catalyzer 46 or higher.

Fourth Embodiment

A fourth embodiment of the present invention will now be described with reference to FIG. 9.

The present embodiment is different from the third embodiment in that one mesh electrode 101*a* for acceleration is provided between a catalyzer 46 and a shower head 42 while the other mesh electrode 101*b* for acceleration is provided between a substrate 1 and a catalyzer 46.

Therefore, in the present embodiment, since the mesh electrodes 101*a* and 101*b* exist on both sides of the catalyzer 46, it is easy to direct the generated reactive species toward the substrate 1. It is desired that the mesh electrodes 101*a* and 101*b* are made or a material having high heat resistance property, and preferably having the same melting point as that of the catalyzer 46 or higher.

Fifth Embodiment

A fifth embodiment of the present invention will now be described with reference to FIGS. 10 and 11.

Figure 10:
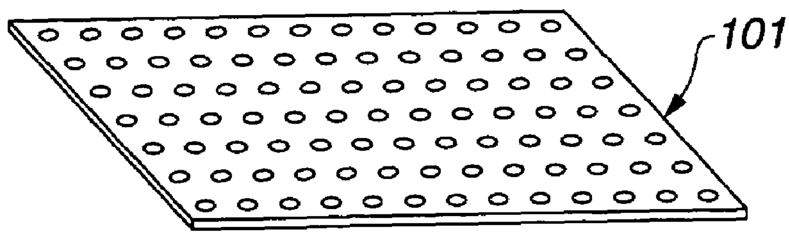
FIG. 10 is a schematic perspective view showing an accelerating electrode used for a DC-bias catalyzed CVD device according to a fifth embodiment of the present invention.
Figure 11:
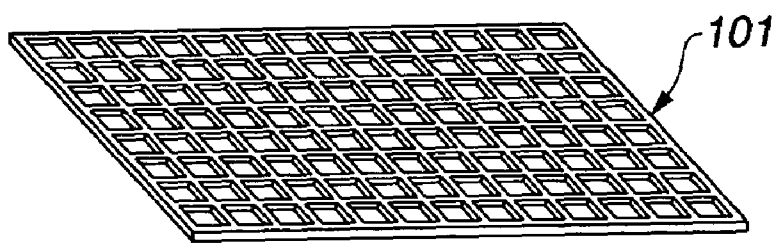
FIG. 11 is a schematic perspective view showing another example of the accelerating electrode used for the DC-bias catalyzed CVD device according to a fifth embodiment of the present invention.

In the present embodiment, the above-described accelerating electrode 101 is formed in the shape of a porous plate as shown in FIG. 10 or in a mesh-shape as shown in FIG. 11 so as to realize an efficient acceleration effect without preventing the gas flow. Such shape is similarly applicable to a catalyzer 46.

Sixth Embodiment

A sixth embodiment of the present invention will now be described with reference to FIG. 12.

Figure 12:
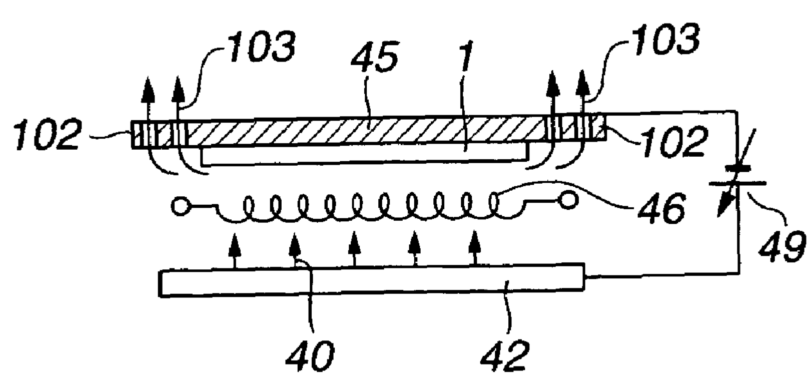
FIG. 12 is a schematic cross-sectional view showing essential parts of a DC-bias catalyzed CVD device according to a sixth embodiment of the present invention.

In the present embodiment, in the case of operating the DC-bias catalyzer CVD device of the first embodiment under the normal pressure, an air passage hole 102 is formed in a suscepter 45 to lead an exhaust gas 103 from the peripheral region of a substrate 1 upward, as shown in FIG. 12, and toward an exhaust port, not shown, so as to prevent the exhaust gas flow contacting the film on the substrate 1.

Therefore, even in the case where the device is operated under the normal pressure, a film of high quality having no contamination can be formed on the substrate 1. Since the device is of the normal-pressure type, it has a simple structure and improved throughput.

Seventh Embodiment

A seventh embodiment of the present invention will now be described with reference to FIGS. 13 to 17.

Figure 13:
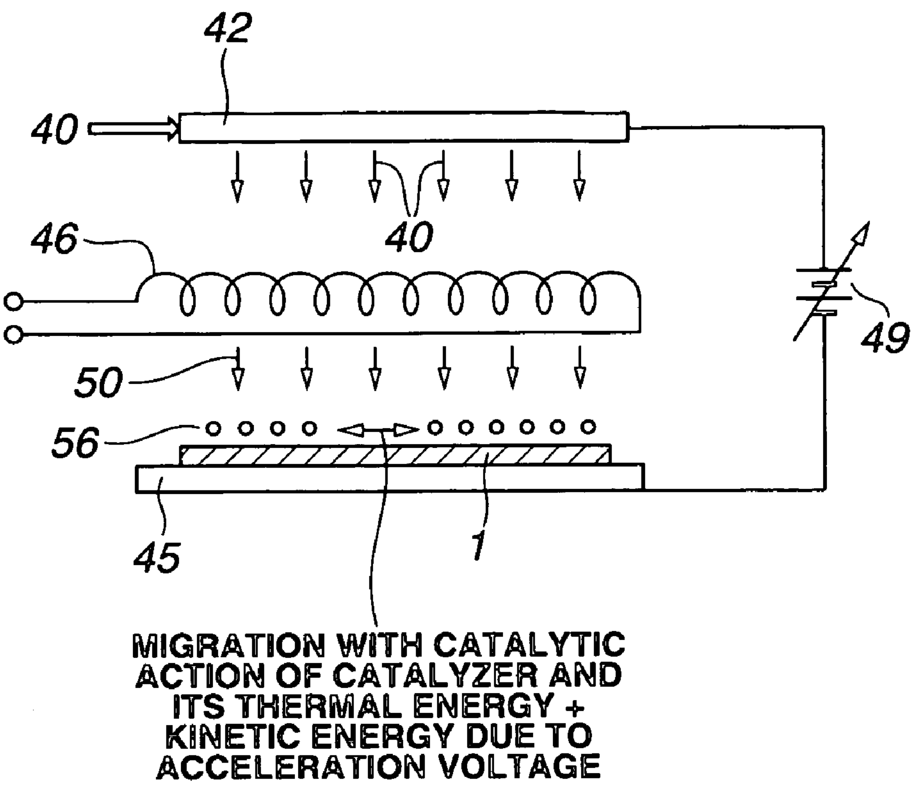
FIG. 13 is a schematic cross-sectional view showing essential parts of a DC-bias catalyzed CVD device according to a seventh embodiment of the present invention.

In each of the above-described embodiments, the substrate 1 is arranged above the shower head 42. The present embodiment is different in that the substrate 1 is arranged under the shower head 42, as shown in FIG. 13. The other parts of the structure and the operating method are the same as those of the foregoing embodiments. Therefore, basically the same advantages as those of the first embodiment are provided.

Figure 14:
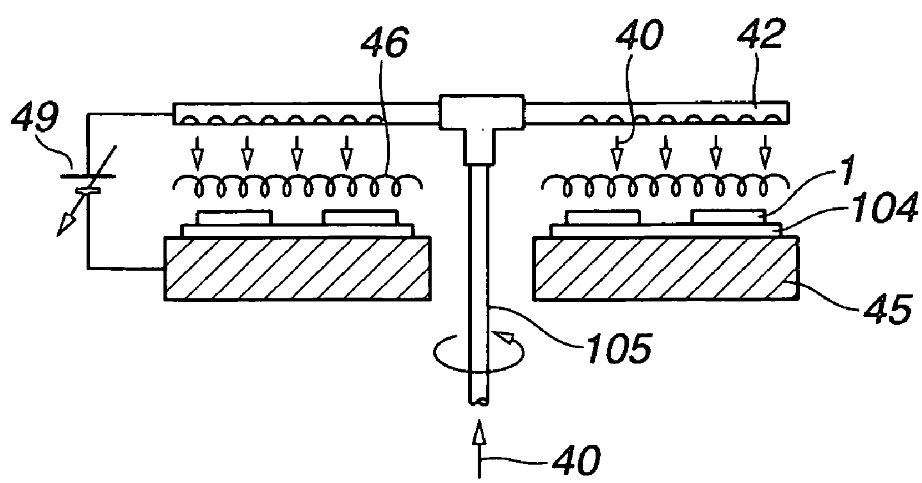
FIG. 14 is a schematic cross-sectional view showing essential parts of another DC-bias catalyzed CVD device.

A normal-pressure type device may be employed as a specific exemplary structure. As shown in FIG. 14, a plurality of substrates 1 are arranged via a rotatable stage 104 on a suscepter 45 having a rotatable heater, and a reaction gas 40 is supplied from a rotatable shower head 42 having a duct/rotating shaft 105 in the center hole of the suscepter. Thus, reactive species produced by a catalyzer 46 (its power source is not shown here and in the following description, too) are deposited to form films on the substrates 1 in a DC field generated by a DC power source 49. The exhaust gas is led downward from the peripheral region of the suscepter 45.

In this example, since the films are formed by accelerating the reactive species toward the substrates while rotating the plurality of substrates 1 and the shower head 42, high productivity is realized and the uniform distribution of the gas improves the uniformity of the produced films.

Figure 15:
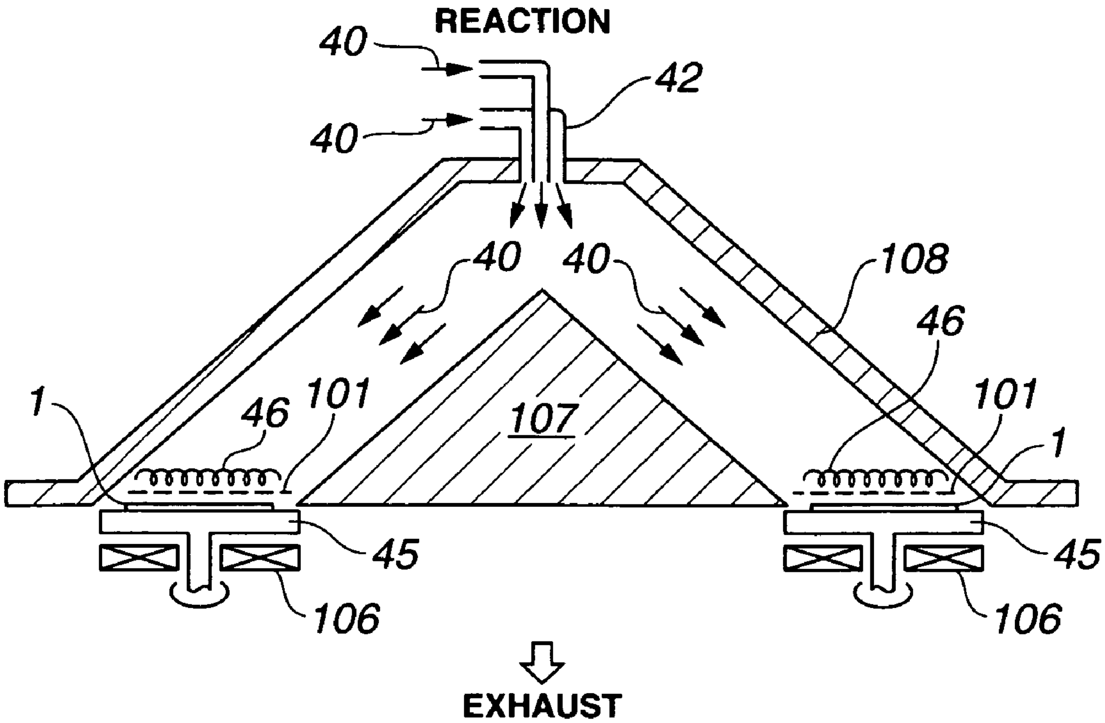
FIG. 15 is a schematic cross-sectional view showing another DC-bias catalyzed CVD device.

In an example shown in FIG. 15, a rotation/revolution type is employed in which a suscepter 45 having a rotatable heater 106 revolves around a conical buffer 107, and substrates 1 are fixed on the respective suscepters 45. A reaction gas 40 is supplied from a shower head 42 above a conical belljar 108, and reactive species produced by a catalyzer 46 are accelerated by a DC voltage applied to mesh electrodes 101 as shown in FIG. 12, thereby forming films on the substrates 1.

In this example, since the films are formed by accelerating the reactive species toward the substrates while causing the plurality of substrates 1 to rotate and revolve in the conical belljar, high productivity is realized and the uniform distribution of the gas improves the uniformity of the produced films.

Figure 16:
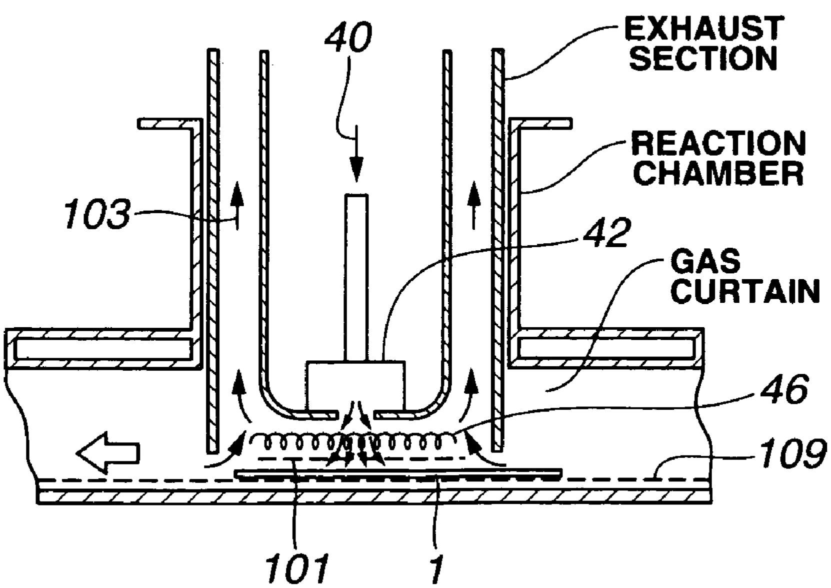
FIG. 16 is a schematic cross-sectional view showing another DC-bias catalyzed CVD device.

FIG. 16 shows another example of the continuous normal-pressure film forming device. A substrate 1 is arranged on a carrier belt 109 and a reaction gas 40 is supplied from a shower head 42. Reactive species produced by a catalyzer 46 are accelerated by a DC voltage applied to a mesh electrode 101 as shown in FIG. 8, thereby forming a film on the substrate 1. Since an exhaust gas 103 is led upward from the substrate 1, there is no problem of contamination of the produced film.

In this example, since the reactive species are accelerated toward the substrate while the substrate 1 is carried into one direction, and the exhaust gas is led upward, high productivity of the produced film is realized and it is easy to form a clean film even with the normal-pressure type device.

Eighth Embodiment

Figure 17:
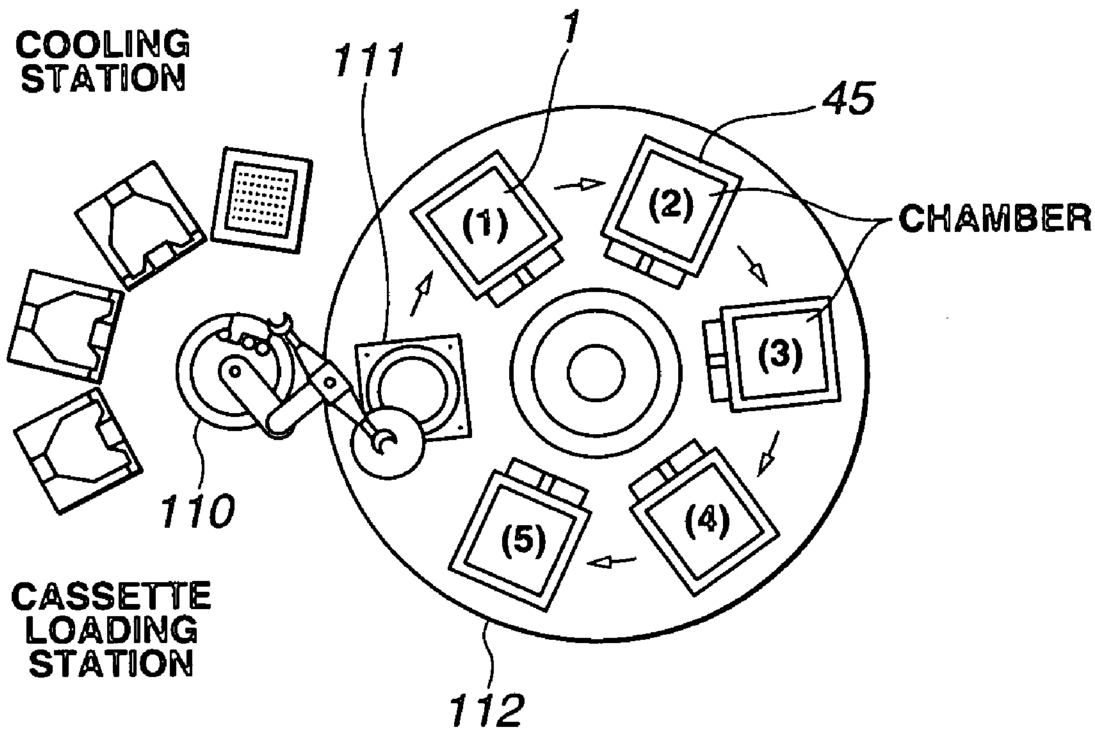
FIG. 17 is a schematic plan view showing essential parts of still another DC-bias catalyzed CVD device.

An eighth embodiment of the present invention will now be described with reference to FIG. 17.

The film forming device of the present embodiment selectively uses, for example, five chambers which are capable of sequentially forming films. The device is adapted for forming an entire film, for example, a multilayer-insulation film as shown in FIG. 5J, by stacking various films. A substrate 1 is vacuum-sucked to a suscepter 45 and is loaded into a loading section 111 by a robot 110 of a loading station. Then, the substrate 1 is sequentially sent to each chamber by a dispersion head 112, during which formation of a film is carried out in the face-down state where the substrate surface faces downward as shown in FIG. 1. The above-described catalyzer 46 and accelerating electrode are not shown in the drawing.

This embodiment is advantageous for formation of a multilayer film. Since a heat source of the substrate 1 is located above, there is less convection effect. Also, since the substrate 1 faces downward, attachment of particles thereto can be restrained.

With the normal-pressure CVD devices described in the above-described respective embodiments, the film can be formed at a much lower temperature than in an epitaxial growth device. Since no corrosive gas is used, the design of the chamber is easier.

Ninth Embodiment

A ninth embodiment of the present invention will now be described with reference to FIGS. 18 and 19.

<RF/DC-Bias Catalyzed CVD Method and Device Therefor>

In the present embodiment, on the basis of the catalyzed CVD method, a reaction gas, made of a hydrogen-based carrier gas and a material gas such as a silane gas or the like, is brought in contact with a heated catalyzer made of tungsten or the like, and an electric field of not higher than a glow discharge starting voltage is caused to act on the radical deposition species or its precursor thus produced and radical hydrogen ions, thus providing kinetic energy. Thus, a predetermined film of polycrystal silicon or the like is formed by vapor growth on an insulating substrate. In this case, a voltage which is produced by superimposing a high-frequency voltage onto a DC voltage and is not higher than the glow discharge starting voltage (a voltage determined by the Paschen's law, for example, a voltage not higher than 1 kV) is applied between the substrate and a counter-electrode, thus directing the radical deposition species or its precursor and radical hydrogen ions toward the substrate, and providing kinetic energy with minutes changes of the electric field. Hereinafter, the CVD method of the present embodiment is referred to as an RF/DC-bias catalyzed CVD method.

Figure 18:
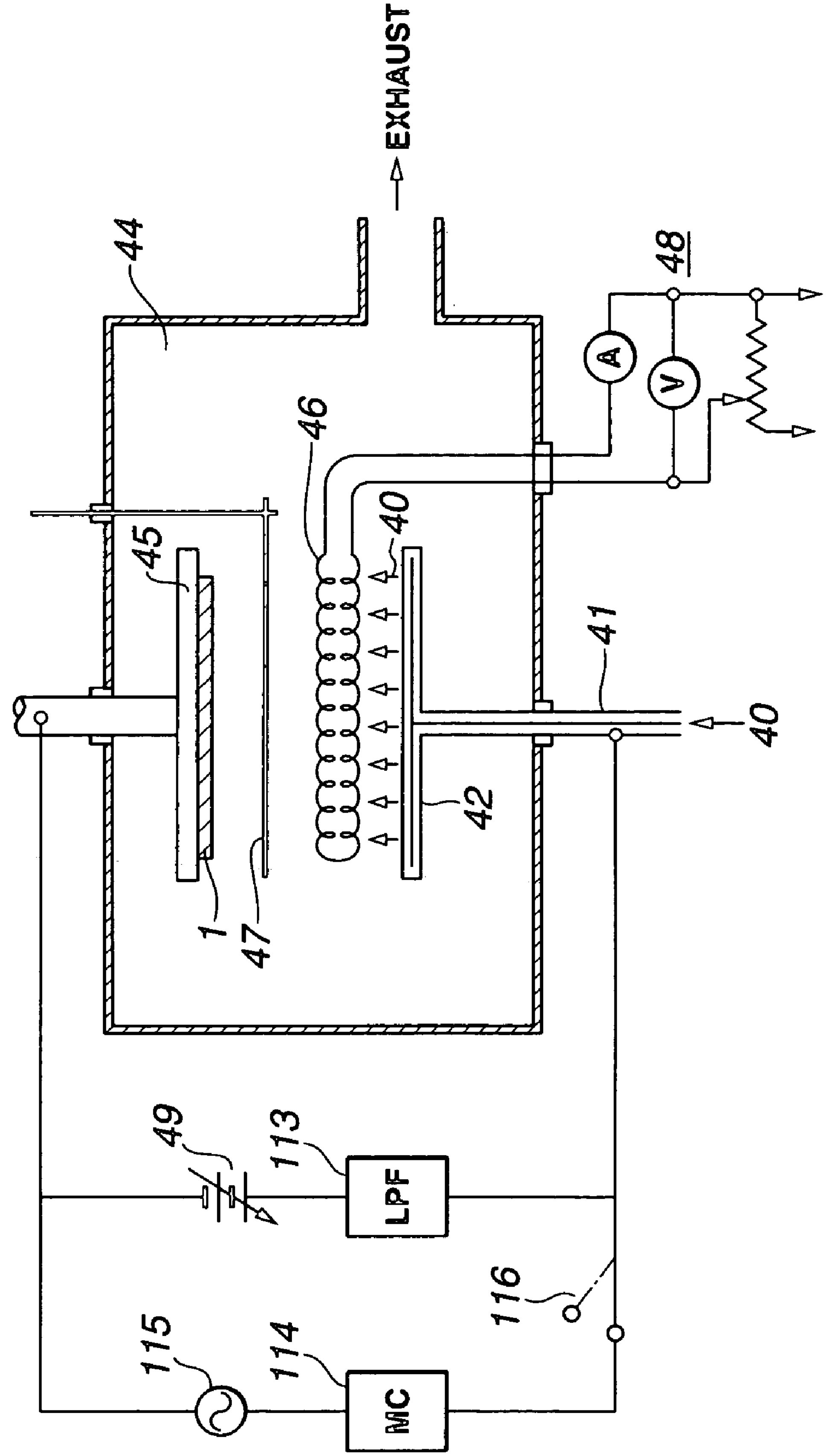
FIG. 18 is a schematic cross-sectional view showing an RF/DC-bias catalyzed CVD device according to a ninth embodiment of the present invention.
Figure 19:
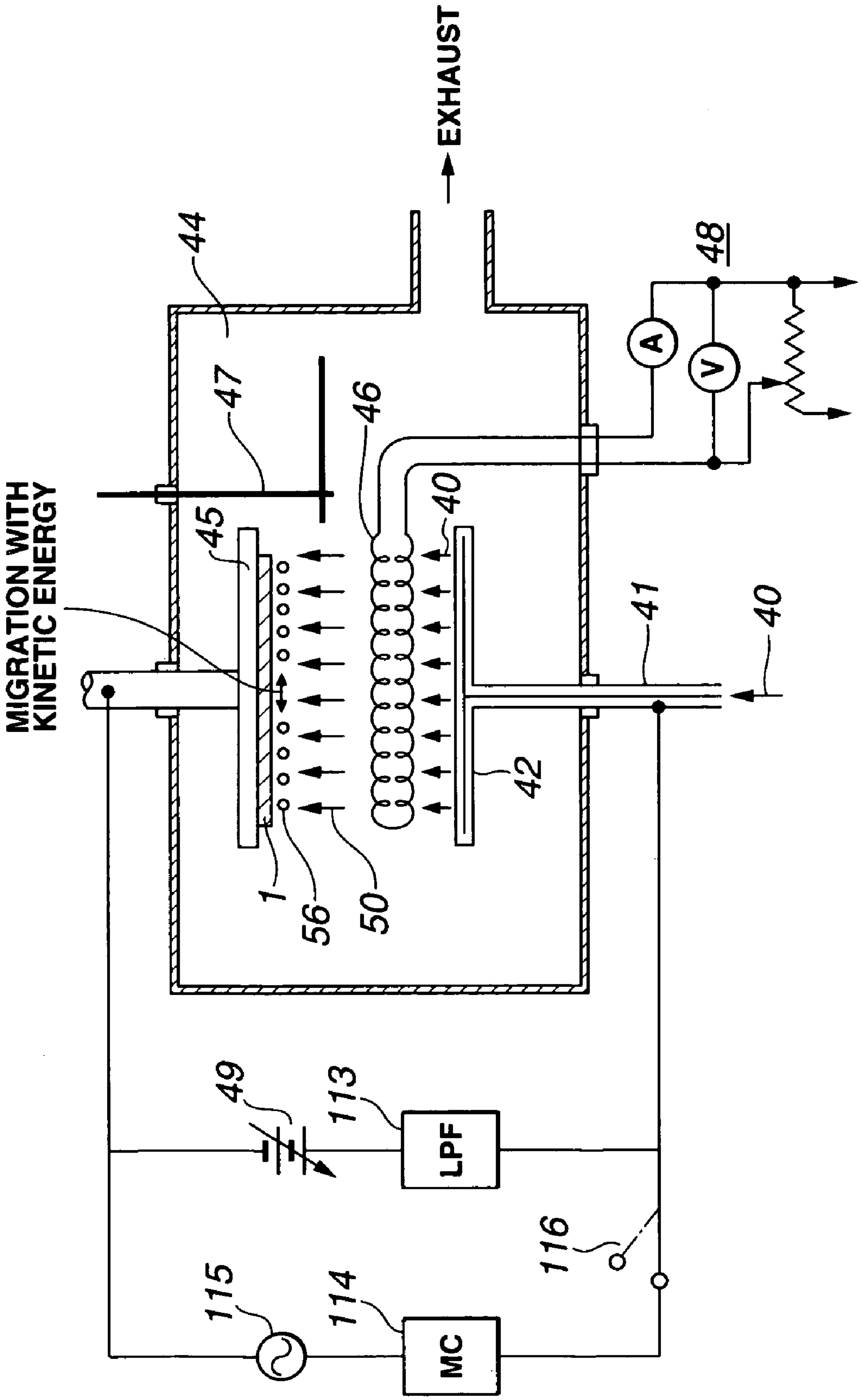
FIG. 19 is a schematic cross-sectional view showing the catalyzed CVD device at the time of CVD.

This RF/DC-bias catalyzed CVD method is carried out using a film forming device as shown in FIGS. 18 and 19.

In this film forming device, that is, the RF/DC-bias catalyzed CVD device, a reaction gas, made of a hydrogen-based carrier gas and a material gas 40 of silicon hydride (such as mono-silane) (also including an appropriate quantity of a doping gas of $B_2H_6$, $PH_3$ or the like, if necessary), is fed from a supply duct 41 to a deposition chamber 44 through a supply port of a shower head 42, as described in FIGS. 1 to 3. Inside the deposition chamber 44, a suscepter 45 for supporting a substrate 1 made of glass or the like, the shower head 42 having high heat resistance property and made of a material preferably having the same melting point as a catalyzer 46 or higher, the coil-shaped catalyzer 46 made of tungsten or the like, and a shutter 47 that can be open/closed are arranged. A magnetic seal is provided between the suscepter 45 and the deposition chamber 44. The deposition chamber 44 is connected to the end of a previous chamber for carrying out a previous step, and is exhausted via a valve by a turbo-molecular pump or the like.

The substrate 1 is heated to the room temperature to 550° C., for example, 200 to 300° C., by heating means such as a heater wire in the suscepter 45, and the catalyzer 46 is heated in the hydrogen-based carrier gas for activation to a temperature not higher than the melting point, particularly 800 to 2000° C., as a resistance wire, and approximately 1600 to 1700° C. in the case of tungsten. Both terminals of the catalyzer 46 are connected to a DC or AC catalyzer power source 48 and are heated to a predetermined temperature by electrification from the power source. The shower head 42 is connected as an accelerating electrode to the positive electrode side of a variable DC power source (not higher than 1 kV, for example, 500 V) 49 from the duct 41 via a low-pass (high-frequency) filter 113, and is also connected to a high-frequency power source 115 (100 to 200 $V_{P-P}$ and 1 to 100 MHZ, for example, 150 $V_{P-P}$ and 13.56 MHZ) via a matching circuit 114. Thus, a DC-bias voltage with a high-frequency voltage superimposed thereon, not higher than 1 kV, is applied between the shower head 42 and the suscepter 45 supporting the substrate 1.

To carry out the RF/DC-bias catalyzed CVD method, the degree of vacuum in the deposition chamber 44 is set at $10^{-6}$ to $10^{-8}$ Torr. The substrate is heated to 200 to 300° C., and the reaction gas 40 made of the hydrogen-based carrier gas and the material gas of a silane gas or the like is fed from the supply port of the shower head 42. The gas pressure is set at $10^{-2}$ to $10^{-3}$ Torr, for example, $10^{-2}$ Torr, and at the same time, the reaction gas is brought into contact with the catalyzer 46 of tungsten or the like heated to 800 to 2000° C., for example, 1650° C. Then, the shutter 47 is opened as shown in FIG. 19.

At least a part of the reaction gas 40 contacts the catalyzer 46 and is catalytically decomposed, thus forming a group of reactive species including ions and radicals such as silicon having high energy, that is, radical deposition species or their precursors and radical hydrogen ions, by catalytic decomposition or thermal decomposition reaction. An RF/DC-bias field produced by superimposing a high-frequency voltage from the high-frequency power source 115 of 150 $V_{p-p}$ and 13.56 MHZ onto the DC voltage from the DC power source 49 of a voltage not higher than the glow discharge starting voltage, for example, 500 V, is caused to act on the resultant reactive species 50 so as to provide kinetic energy with minute changes of the electric field, thereby directing and concentrating the reactive species toward the substrate 1 and activating the migration at the time of film formation. Thus, a predetermined film of polycrystal silicon or the like is formed by vapor growth on the substrate 1 which is held at the room temperature to 550° C., for example, 200 to 300° C.

Since the reactive species are thus provided with the catalytic action of the catalyzer 46 and with the directional kinetic energy which is obtained by adding the acceleration energy accompanying changes of the electric field due to the (DC+high frequency) field to the thermal energy of the catalytic action without generating plasma, the reaction gas can be efficiently changed to the reactive species, which can be uniformly deposited on the substrate 1 by thermal CVD using the (DC+high frequency) field. Since these deposition species 56 migrate on the substrate 1 and are diffused in the thin film, a semiconductor film of minute (high-density), flat and uniform polycrystal silicon or the like having high step coverage, a metal film made of aluminum or copper, or an insulation thin film made of silicon nitride or the like can be formed in tight contact with the surface of the substrate having a complicated shape with steps and a via-hole of a high aspect ratio like a very-large-scale integrated circuit (VLSI).

Thus, in the RF/DC-bias catalyzed CVD of the present embodiment, the production of the thin film is controlled by the independent, arbitrary (DC+high frequency) field, in comparison with the temperature of the substrate, the temperature of the catalyzer, the gas pressure (the flow rate of the reaction gas), the type of the material gas or the like as control factors of the conventional catalyzed CVD. Therefore, the tight contact between the produced film and the substrate, the density of the produced film, the uniformity or smoothness of the produced film, burying into a via-hole or the like, and the step coverage are improved and the temperature of the substrate is lowered further to enable stress control of the produced film. Thus, a film of high quality, for example, a silicon film or metal film having a bulk-like property, can be provided. In addition, since the reactive species produced by the catalyzer 46 can be independently controlled by the (DC+high frequency) field and efficiently deposited on the base, it is possible to realize higher utilization efficiency of the reaction gas, a higher production speed, improvement in productivity, and reduction in cost due to reduction in the quantity of the reaction gas.

Since the deposition species have large kinetic energy even when the temperature of the substrate is lowered, an intended film of good quality is obtained. Therefore, the temperature of the substrate can be lowered further as described above and an insulating substrate such as a glass substrate made of boro-silicate glass, alumino-silicate glass or the like, or a heat-resistant resin substrate made of polyimide or the like can be used. It is again possible to realize reduction in cost. In addition, since the shower head 42 for supplying the reaction gas can be also used as the electrode for accelerating the reactive species, a simple structure may be employed.

Moreover, since no plasma is generated, a film having no damage due to plasma and with low stress can be provided and a device which is more simple and inexpensive than in the plasma CVD method can be realized.

In this case, though operation can be done under a reduced pressure, for example, $10^{-3}$ to $10^{-2}$ Torr, or under a normal pressure, an apparatus of normal-pressure type is more simple and inexpensive than an apparatus of reduced-pressure type. Since the above-described electric field is applied in the normal-pressure type, too, a film of high quality having excellent density, uniformity and tight contact is provided. In this case, too, the normal-pressure type realizes a greater throughput, higher productivity and greater reduction in cost than the reduced-pressure type.

In the case of the reduced-pressure type, the (DC+high frequency) voltage is affected by the gas pressure (the flow rate of the reaction gas) and the type of the material gas. In any case, it is necessary to adjust the DC voltage to an arbitrary voltage not higher than the glow discharge starting voltage. In the case of the normal-pressure type, though there is no discharge, it is desired to adjust the exhaust gas flow so as not to contact the substrate, in order to prevent the flow of the material gas and reactive species from adversely affecting the thickness and quality of the film.

In the above-described CVD, though the temperature of the substrate is increased by heat radiation from the catalyzer 46, the substrate heater 51 may be installed as described above, if necessary. While the catalyzer 46 is in the coil-shape (it may also be in the shape of a mesh or porous plate), it is preferred to provide the catalyzer in a plurality of stages, for example, two to three stages, in the direction of the gas flow so as to increase the contact area with the gas. In this CVD, since the substrate 1 is set on the lower surface of the susceptor 45 and thus arranged above the shower head 42, no particle generated in the deposition chamber 44 will fall and adhere to the substrate 1 and the film thereon.

In the present embodiment, after the above-described RF/DC-bias catalyzed CVD is carried out, the substrate 1 is taken out of the deposition chamber 44 and a reaction gas 57 of $CF_4$, $C_2F_6$, $SF_6$, $H_2$, $NF_3$ or the like (with the degree of vacuum equal to $10^{-2}$ to several Torr) is fed, as shown in FIG. 4. Then, a high-frequency voltage 58 or a DC voltage is applied between the susceptor 45 of the substrate 1 and the shower head 42 as the counter-electrode, thereby causing plasma discharge. Thus, the inside of the deposition chamber 44 can be cleaned. The plasma-generating voltage in this case is not lower than 1 kV, particularly, several kV to tens of kV, for example, 10 kV.

Figure 6:
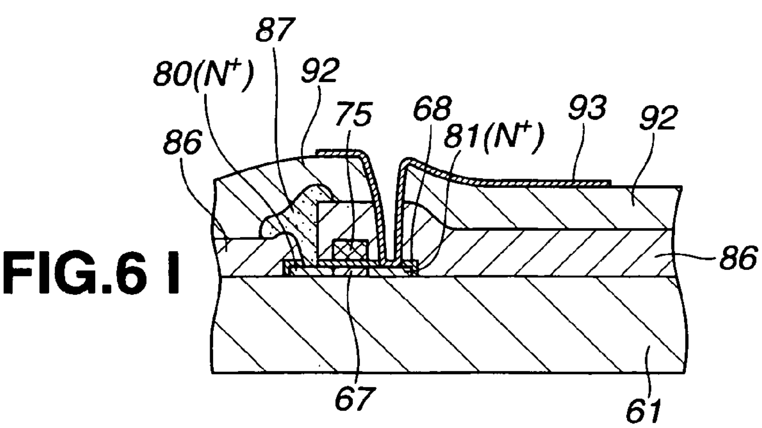

In the present embodiment, too, similarly to the first embodiment, the RF/DC-bias catalyzed CVD method in place of the DC-bias catalyzer CVD method can be applied to the manufacture of a MOSTFT and the manufacture of a liquid crystal display device (LCD) shown in FIGS. 5 and 6.

A switch 116 may be provided on the previous stage of the matching circuit 114, as indicated by a dotted line in FIGS. 18 and 19, so that the switch 116 is turned on to carry out the above-described RF/DC-bias catalyzed CVD method. If the switch 116 is turned off, the DC-bias catalyzed CVD method of the first embodiment for actuating only the DC power source 49 can be carried out.

Tenth Embodiment

A tenth embodiment of the present invention will now be described with reference to FIG. 20.

Figure 20:
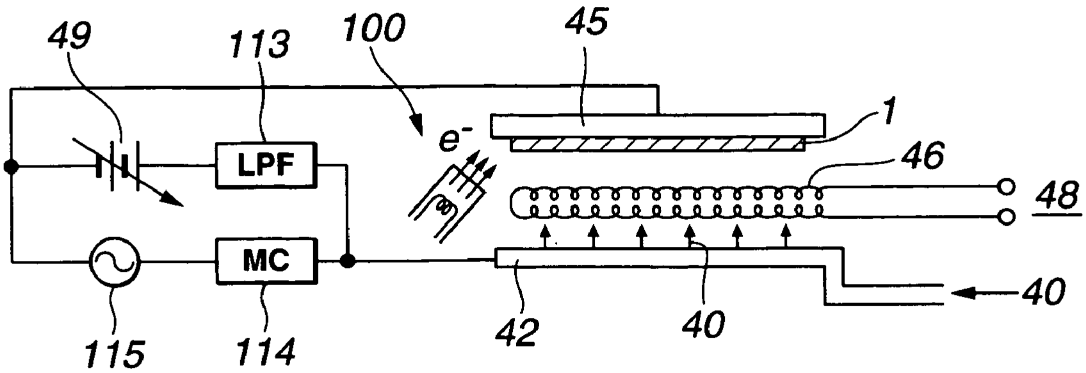
FIG. 20 is a schematic cross-sectional view showing essential parts of an RF/DC-bias catalyzed CVD device according to a tenth embodiment of the present invention.

In the present embodiment, using the RF/DC-bias-catalyzed CV-D method and the device therefor of the ninth embodiment, charged particles or ions are provided, that is, an electron shower 100 is provided near a substrate 1 or a susceptor 45 as shown in FIG. 20. Therefore, in addition to the effect of the ninth embodiment, an excellent effect can be realized as follows.

At the time of or during the formation of the above-described polycrystal silicon film, radical deposition species of high energy or their precursors and ions might be generated in the reaction gas due to catalytic action of a catalyzer 46, and charge up the substrate 1, thus causing unevenness in the film formation and deterioration in the performance of the film or device. However, by irradiating the ions and the like with electrons having directionality and concentration due to a DC field from the electron shower 100, the charges on the substrate 1 can be neutralized to enable satisfactory prevention of the charge-up. Particularly, when the substrate 1 is made of an insulation material, electric charges tend to be accumulated. Therefore, the use of the electron shower 100 turns out to be effective.

Meanwhile, by providing, in the ninth embodiment, a susceptor 45 having a mesh electrode 101 for acceleration and an air passage hole 102 as described in the third to sixth embodiments, the similar effect can be provided.

Eleventh Embodiment

Figure 21:
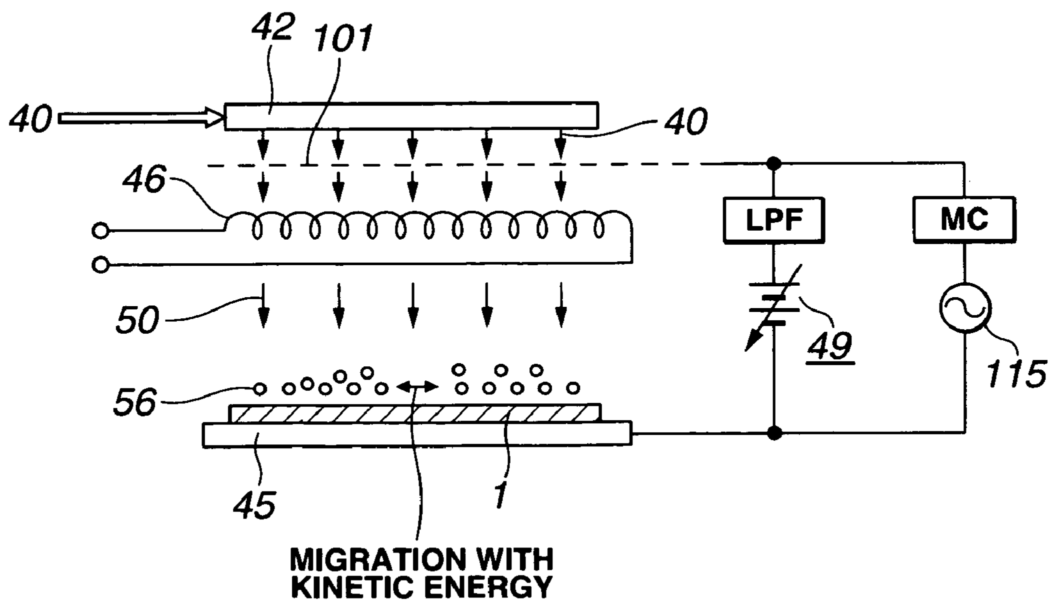
FIG. 21 is a schematic cross-sectional view showing essential parts of an RF/DC-bias catalyzed CVD device according to an eleventh embodiment of the present invention.

An eleventh embodiment of the present invention will now be described with reference to FIG. 21.

In each of the above-described embodiments, the substrate 1 is arranged above the shower head 42. The present embodiment is different in that the substrate 1 is arranged under the shower head 42, as shown in FIG. 13. The other parts of the structure and the operating method are the same as those of the foregoing embodiments. Therefore, basically the same advantages as those of the ninth embodiment are provided. In FIG. 21, a numeral 101 represents a mesh electrode, and a DC voltage having a high-frequency voltage superimposed thereon is applied between the mesh electrode or the shower head 42 and the substrate 1.

A normal-pressure type device may be employed as a specific exemplary structure, which may be applied to a film forming device of the structure shown in FIGS. 14 to 17.

Twelfth Embodiment

A twelfth embodiment of the present invention will now be described with reference to FIG. 22.

<AC/DC-Bias Catalyzed CVD Method and Device Therefor>

In the present embodiment, on the basis of the catalyzed CVD method, a reaction gas, made of a hydrogen-based carrier gas and a material gas such as a silane gas or the like, is brought in contact with a heated catalyzer made of tungsten or the like, and an electric field of not higher than a glow discharge starting voltage is caused to act on the radical deposition species or its precursor thus produced and radical hydrogen ions, thus providing kinetic energy. Thus, a predetermined film of polycrystal silicon or the like is formed by vapor growth on an insulating substrate. In this case, a voltage which is produced by superimposing a low-frequency voltage onto a DC voltage and is not higher than the glow discharge starting voltage, that is, a voltage determined by the Paschen's law, for example, a voltage not higher than 1 kV, is applied between the substrate and a counter-electrode, thus directing the radical deposition species or its precursor and radical hydrogen ions toward the substrate, and providing kinetic energy with changes of the electric field. Hereinafter, the CVD method of the present embodiment is referred to as an AC/DC-bias catalyzed CVD method.

Figure 22:
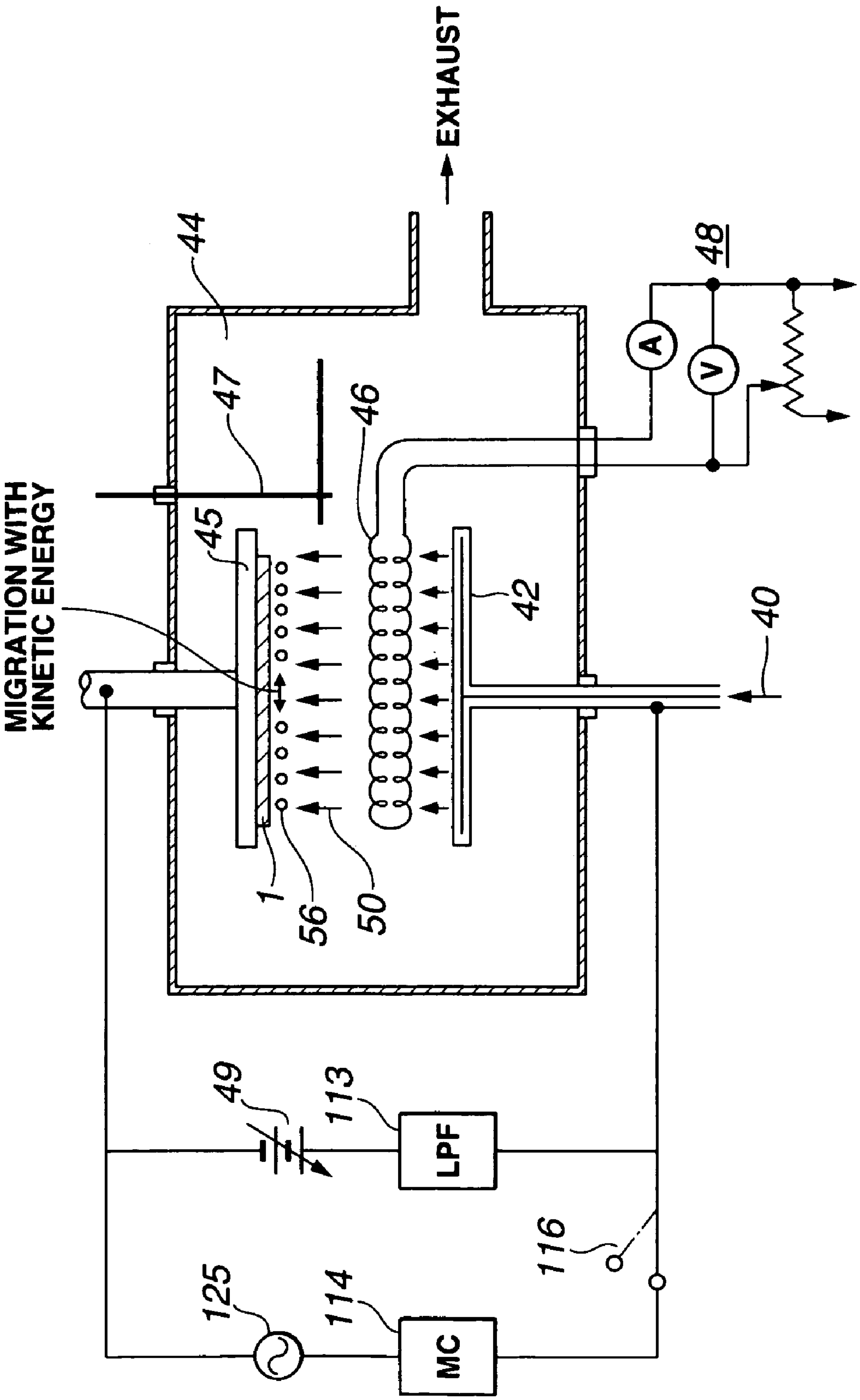
FIG. 22 is a schematic cross-sectional view showing an AC/DC-bias catalyzed CVD device according to a twelfth embodiment of the present invention.

This AC/DC-bias catalyzed CVD method is carried out using a film forming device which uses a low-frequency power source 125 in place of the high-frequency power source 115 of the ninth-embodiment, with the other parts of the structure being the same as those of the ninth embodiment, as shown in FIG. 22.

Specifically, the shower head 42 is connected as an accelerating electrode to the positive electrode side of a variable DC power source (not higher than 1 kV, for example, 500 V) 49 via the duct 41 (the above-described low-pass filter 113 can be omitted), and is also connected to the low-frequency power source 125 (100 to 200 $V_{P-P}$ and not higher than 1 MHZ, for example, 150 $V_{P-P}$ and 26 kHz) via a matching circuit 114. Thus, a DC-bias voltage with a low-frequency voltage superimposed thereon, not higher than 1 kV, is applied between the shower head 42 and the suscepter 45 supporting the substrate 1.

Since the reactive species are thus provided with the catalytic action of the catalyzer 46 and with the directional kinetic energy which is obtained by adding the acceleration energy accompanying changes of the electric field due to the (DC+low frequency) field to the thermal energy of the catalytic action without generating plasma, the reaction gas can be efficiently changed to the reactive species, which can be uniformly deposited on the substrate 1 by thermal CVD using the (DC+low frequency) field. Since these deposition species 56 migrate on the substrate 1 and are diffused in the thin film, a semiconductor film of minute (high-density), flat and uniform polycrystal silicon or the like having high step coverage, a metal film made of aluminum or copper, or an insulation thin film made of silicon nitride or the like can be formed in tight contact with the surface of the substrate having a complicated shape with steps and a via-hole of a high aspect ratio like a very-large-scale integrated circuit (VLSI). In addition, advantages similar those of the ninth embodiment can be provided.

In the present embodiment, after the above-described AC/DC-bias catalyzed CVD is carried out, the substrate 1 is taken out of the deposition chamber 44 and a reaction gas 57 of $CF_4$, $C_2F_6$, $SF_6$, $H_2$, $NF_3$ or the like (with the degree of vacuum equal to $10^{-2}$ to several Torr) is fed, as shown in FIG. 4. Then, a high-frequency voltage 58 or a DC voltage is applied between the suscepter 45 of the substrate 1 and the shower head 42 as the counter-electrode, thereby causing plasma discharge. Thus, the inside of the deposition chamber 44 can be cleaned.

In the present embodiment, too, similarly to the first embodiment, the AC/DC-bias catalyzed CVD method in place of the DC-bias catalyzer CVD method can be applied to the manufacture of a MOSTFT and the manufacture of a liquid crystal display device (LCD) shown in FIGS. 5 and 6.

A switch 116 may be provided on the previous stage of the matching circuit 114, as indicated by a dotted line in FIG. 22, so that the switch 116 is turned on to carry out the above-described AC/DC-bias catalyzed CVD method. If the switch 116 is turned off, the DC-bias catalyzed CVD method of the first embodiment for actuating only the DC power source 49 can be carried out.

Figure 9:
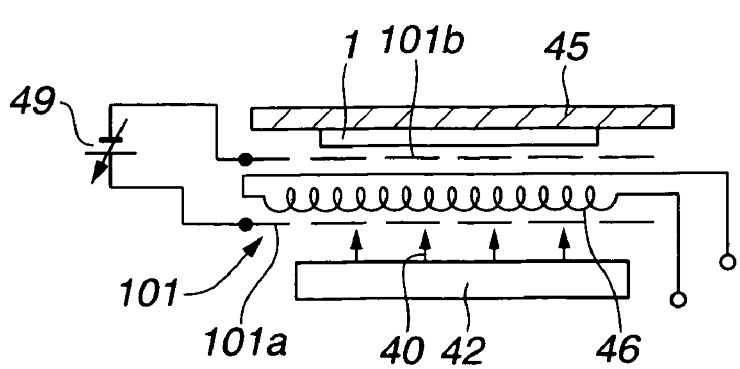
FIG. 9 is a schematic cross-sectional view showing essential parts of a DC-bias catalyzed CVD device according to a fourth embodiment of the present invention.

Also, the embodiments shown in FIGS. 7, 8 and 9 may be applied to the AC/DC-bias catalyzed CVD method of the present embodiment, so as to irradiate with electron beams for neutralizing electric charges or to use the mesh electrode as an accelerating electrode.

Thirteenth Embodiment

A thirteenth embodiment of the present invention will now be described with reference to FIG. 23.

In the present embodiment, various material gases are used in the above-described embodiments, thus forming various thin films corresponding to the material gases. In the present embodiment, any of the above-described DC-bias, RF/DC-bias and AC/DC-bias catalyzed CVD methods is applicable.

With respect to the above-described embodiments of the present invention, various modifications can be effected based on the technical idea of the present invention.

For example, various modifications may be effected with respect to the film forming condition, the structure of the device, and the type of the material gas to be used and the film to be formed.

Depending on the substrate to be used, a predetermined shape of step is formed at a predetermined position on the surface of the insulating substrate by means of dry etching or the like, and with the bottom corner of this step as a seed, deposition of single-crystal silicon, that is, so-called grapho-epitaxial growth, can be carried out at a lower temperature by the catalyzed CVD method during the application of the DC-bias, AC/DC-bias, or RF/DC-bias field of the present invention. Also, by forming on the surface of the substrate a layer of a material having good lattice matching with single-crystal silicon, for example, a crystalline sapphire layer, or a spinel structure such as a layer of magnesia spinel ($MgO \cdot Al_2O_3$) or calcium fluoride ($CaF_2$), hetero epitaxial growth, that is, deposition of single-crystal silicon, can be carried out at a lower temperature, using the produced layer as a seed, by the catalyzed CVD method during the application of the DC-bias, AC/DC-bias, or RF/DC-bias field of the present invention.

As such deposition at a low temperature is made possible, a substrate of low cost and good property such as a glass substrate having a relatively low strain point that can be easy to obtain can be used, thereby enabling increase in the size of the substrate. Since the crystalline sapphire layer serves as a diffusion barrier against various atoms, diffusion of impurity from the glass substrate can be restrained. The electron mobility of such silicon single-crystal thin film is not lower than 540 $cm^2/v \cdot sec$, which is as large a value as that of a silicon substrate. Therefore, in addition to a high-speed and large-current-density transistor, semiconductor devices such as high-performance diode, capacitor and resistor, or an electronic circuit formed by integrating these devices, can be prepared on an insulating substrate of a heat-resistant resin substrate or a glass substrate.

Instead of the above-described electron shower for preventing the charge-up, irradiation with particles of other negative charges may be carried out, or alternatively, irradiation of particles of positive charges such as proton may be carried out depending on the polarity of the charge-up. In the ninth to twelfth embodiments, too, the electric field application means described in the third to eighth embodiments can be employed.

Figure 24A:
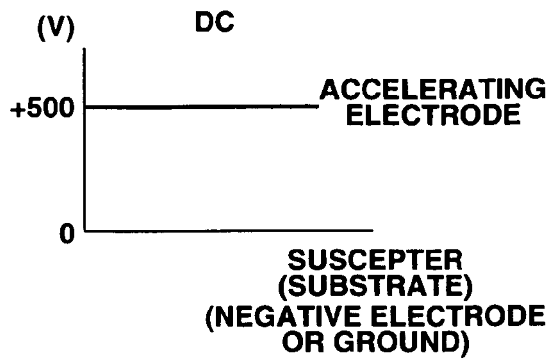
FIGS. 24A and 24B are schematic views showing various voltage application methods at the time of bias catalyzed CVD according to the present invention.
Figure 24B:
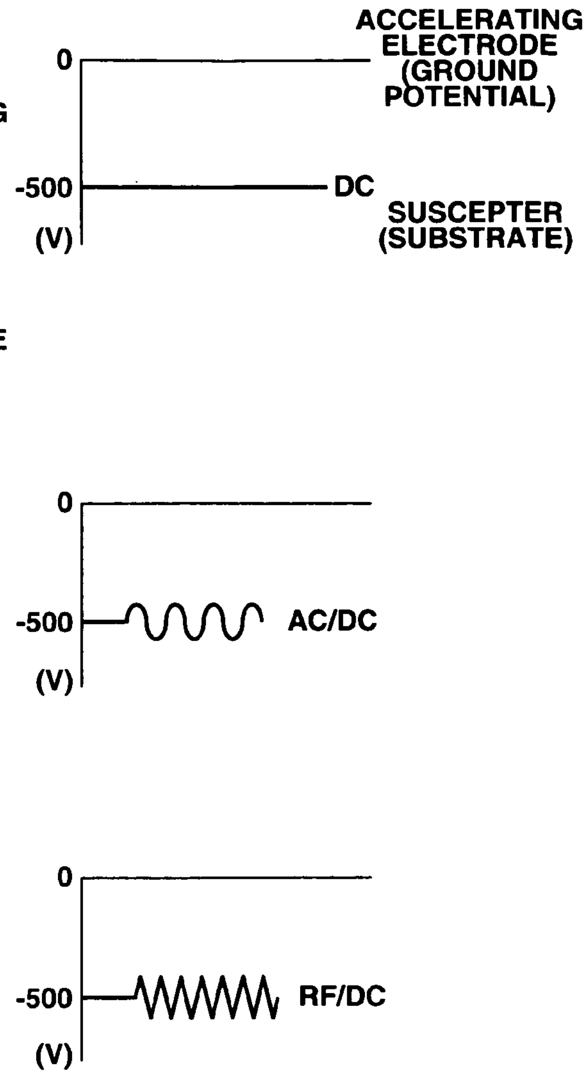

For the application of the electric field, a method of applying a positive electrode potential to the accelerating electrode and applying a negative electrode or ground potential to the suscepter (substrate), as shown in FIG. 24A, or a method of applying a ground potential to the accelerating electrode and applying a negative electrode potential to the suscepter (substrate), as shown in FIG. 24B, may be employed. The application of the electric field can be carried out, using only a high-frequency AC voltage, or only a low-frequency AC voltage, or an AC voltage produced by superimposing a high-frequency AC voltage on a low-frequency AC voltage. However, the absolute value of the AC voltage is not higher than the glow discharge starting voltage. Alternatively, a voltage produced by superimposing a high-frequency AC voltage and a low-frequency AC voltage onto a DC voltage may be used. However, the absolute value of the voltage is not higher than the glow discharge starting voltage. This voltage may be varied during the formation of the film. Also, by providing means for applying an electric field of a DC voltage or the like between the electrode and the suscepter and for measuring a current flowing between them, and providing a curve and tracer for displaying current-voltage characteristics, the quality of the film may be detected during the formation of the film. In addition, the value of the current at the characteristic value during the application of the electric field may be fed back to the power source for the application of the electric field, the power source for the heat catalyzer, or the mass flow controller of the gas supply system, so as to provide constantly uniform quality of the film.

INDUSTRIAL APPLICABILITY

According to the present invention, a reaction gas is brought in contact with a heated catalyzer and an electric field of not higher than a glow discharge starting voltage is caused to act on the produced reactive species so as to provide directional kinetic energy, thus forming a predetermined film on a base by vapor growth. Therefore, since the reactive species are provided with a catalytic action of the catalyzer and its thermal energy as well as an acceleration field due to the voltage, large directional kinetic energy is provided. Thus, the reactive species can be efficiently led onto the base, and sufficient migration on the base and diffusion in the film during the formation process are realized. It is thus possible to realize improvement in tight contact between the produced film and the base, improvement in the density of the produced film, improvement in the uniformity or smoothness of the produced film, improvement in the burying property into a via-hole or the like and the step coverage, further lowering of the temperature of the base, and stress control of the produced film. Thus, a film of high quality can be provided.

The invention claimed is:

1. A film forming method in which a reaction gas is brought into contact with a heated catalyzer and an electric field of not higher than a glow discharge starting voltage is caused to act on the produced reactive species, thereby providing kinetic energy and carrying out vapor growth of a predetermined film on a base.

2. The film forming method as claimed in claim 1, wherein a DC voltage not higher than the glow discharge starting voltage is applied to direct the reactive species toward the base.

3. The film forming method as claimed in claim 1, wherein the catalyzer and an electrode for applying the electric field are arranged between the base and a reaction gas supply means.

4. The film forming method as claimed in claim 1, wherein the catalyzer or an electrode for applying the electric field is formed in the shape of a coil, wire, mesh, or porous plate.

5. The film forming method as claimed in claim 1, wherein after vapor growth of the predetermined film, the base is taken out of a deposition chamber and a voltage is applied between predetermined electrodes to generate plasma discharge, thereby cleaning the inside of the deposition chamber with the plasma discharge.

6. The film forming method as claimed in claim 1, wherein the vapor growth is carried out under a reduced pressure or a normal pressure.

7. The film forming method as claimed in claim 1, wherein the catalyzer is made of at least one type of material selected from the group consisting of tungsten, thoria-containing tungsten, titanium, molybdenum, platinum, palladium, vanadium, silicon, alumina, ceramics with metal adhered thereto, and silicon carbide.

8. The film forming method as claimed in claim 1, wherein the catalyzer is heated in a hydrogen-based gas atmosphere before supplying the material gas.

9. The film forming method as claimed in claim 1, wherein a thin film is formed for a silicon semiconductor device, a silicon semiconductor integrated circuit device, a silicon-germanium semiconductor device, a silicon-germanium semiconductor integrated circuit device, a compound semiconductor device, a compound semiconductor integrated circuit device, a silicon carbide semiconductor device, a silicon carbide semiconductor integrated circuit device, a high dielectric memory semiconductor device, a ferroelectric memory semiconductor device, a liquid crystal display device, an electroluminescence display device, a plasma display panel (PDP) device, a field emission display (FED) device, a light-emitting polymer display device, a light-emitting diode display device, a CCD area/linear sensor device, a MOS sensor device, or a solar battery device.

10. The film forming method as claimed in claim 1, wherein as the voltage forming the electric field (with its absolute value being not higher than the glow discharge starting voltage), only a high-frequency AC voltage, or only a low-frequency AC voltage, or a voltage produced by superimposing a high-frequency AC voltage on a low-frequency AC voltage.

11. The film forming method as claimed in claim 10, wherein the high-frequency voltage has a frequency of 1 MHZ to 10 GHz and the low-frequency voltage has a frequency less than 1 MHZ.

12. The film forming method as claimed in claim 1, wherein the catalyzer is arranged between the base and an electrode for applying the electric field.

13. The film forming method as claimed in claim 12, wherein a gas supply port for leading out the reaction gas is formed in the electrode.

14. The film forming method as claimed in claim 1, wherein the reactive species are irradiated with charged particles for preventing charging.

15. The film forming method as claimed in claim 14, wherein an electron beam or proton is used as the charged particles.

16. The film forming method as claimed in claim 1, wherein the catalyzer is heated to a temperature within a range of 800 to 2000° C. and lower than its melting point, and the reactive species, produced by catalytic reaction or thermal decomposition of at least a part of the reaction gas with the heated catalyzer, are used as material species so as to deposit a thin film by a thermal CVD method on the base heated to the room temperature to 550° C.

17. The film forming method as claimed in claim 16 wherein the catalyzer is heated by its own resistance heating.

18. The film forming method as claimed in claim 1, wherein any one of the following gases (a) to (p) is used as a material gas:

(a) silicon hydride or its derivative;

(b) mixture of silicon hydride or its derivative and gas containing hydrogen, oxygen, nitrogen, germanium, carbon, tin, or lead;

(c) mixture of silicon hydride or its derivative and gas containing impurity made of a group III or group V element of the periodic table;

(d) mixture of silicon hydride or its derivative, gas containing hydrogen, oxygen, nitrogen, germanium, carbon, tin, or lead, and gas containing impurity made of a group III or group V element of the periodic table;

(e) aluminum compound gas;
(f) mixture of aluminum compound gas and gas containing hydrogen or oxygen;
(g) indium compound gas;
(h) mixture of indium compound gas and gas containing oxygen;
(i) fluoride gas, chloride gas or organic compound gas of a refractory metal;
(j) mixture of fluoride gas, chloride gas or organic compound gas of a refractory metal and silicon hydride or its derivative;
(k) mixture of titanium chloride and gas containing nitrogen and/or oxygen;
(l) copper compound gas;
(m) mixture of aluminum compound gas, hydrogen or hydrogen compound gas, silicon hydride or its derivative, and/or copper compound gas;
(n) hydrocarbon or its derivative;
(o) mixture of hydrocarbon or its derivative and hydrogen gas; and
(p) organic metal complex, alkoxide.

19. The film forming method as claimed in claim 18, wherein the following thin films and tubular carbon polyhedrons are formed by vapor growth: polycrystal silicon; single-crystal silicon; amorphous silicon; microcrystal silicon; compound semiconductors such as gallium-arsenide, gallium-phosphorus, gallium-indium-phosphorus, gallium-nitride and the like; semiconductor thin films of silicon carbide, silicon-germanium and the like; a diamond thin film; an n-type or p-type carrier impurity-containing diamond thin film; a diamond-like carbon thin film; an insulating thin films of silicon oxide, impurity-containing silicon oxide, silicon nitride, silicon oxynitride, titanium oxide, tantalum oxide, aluminum oxide and the like; oxidative thin films of indium oxide, indium-tin oxide, palladium oxide and the like; metal thin films of refractory metals such as tungsten, molybdenum, titanium, zirconium and the like, conductive nitride metal, copper, aluminum, aluminum-silicon alloy, aluminum-silicon-copper alloy, aluminum-copper alloy and the like; a thin film having a high dielectric constant such as BST and the like; and ferroelectric thin films made of PZT, LPZT, SBT, BIT and the like.

20. The film forming method as claimed in claim 1, wherein a voltage not higher than the glow discharge starting voltage and produced by superimposing an AC voltage on a DC voltage is applied.

21. The film forming method as claimed in claim 20, wherein the AC voltage is a high-frequency voltage and/or a low-frequency voltage.

22. The film forming method as claimed in claim 21, wherein the high-frequency voltage has a frequency of 1 MHZ to 10 GHz and the low-frequency voltage has a frequency less than 1 MHZ.

* * * * *